(12) United States Patent
Huangfu et al.

(10) Patent No.: US 12,058,910 B2
(45) Date of Patent: Aug. 6, 2024

(54) PIXEL ARRANGEMENT STRUCTURE AND DRIVING METHOD THEREOF, DISPLAY SUBSTRATE AND DISPLAY DEVICE

(71) Applicant: BOE TECHNOLOGY GROUP CO., LTD., Beijing (CN)

(72) Inventors: Lujiang Huangfu, Beijing (CN); Xiaodan Jin, Beijing (CN); Yinan Liang, Beijing (CN); Zhenzhen Li, Beijing (CN); Wenjing Tan, Beijing (CN); Libin Liu, Beijing (CN); Qian Yang, Beijing (CN); Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 17/551,341

(22) Filed: Dec. 15, 2021

(65) Prior Publication Data

US 2022/0109033 A1    Apr. 7, 2022

Related U.S. Application Data

(63) Continuation of application No. 17/108,691, filed on Dec. 1, 2020, now Pat. No. 11,233,096, which is a
(Continued)

(30) Foreign Application Priority Data

Feb. 18, 2016  (CN) .......................... 201620127445.0
Jul. 22, 2016  (CN) .......................... 201610585894.4
(Continued)

(51) Int. Cl.
*H10K 59/35* (2023.01)
*G02F 1/1343* (2006.01)
(Continued)

(52) U.S. Cl.
CPC ..... *H10K 59/353* (2023.02); *G02F 1/134345* (2021.01); *G09G 3/2003* (2013.01);
(Continued)

(58) Field of Classification Search
None
See application file for complete search history.

(56) References Cited

U.S. PATENT DOCUMENTS 4,491,863 A    1/1985   Kurahashi
4,652,912 A    3/1987   Masubuchi
(Continued)

FOREIGN PATENT DOCUMENTS

AU    2018408152 A1    10/2019
CN    101192382 A      6/2008
(Continued)

OTHER PUBLICATIONS

Extended European Search Report in European Application No. 19933238.8 dated Oct. 18, 2022.
(Continued)

*Primary Examiner* — Parul H Gupta
(74) *Attorney, Agent, or Firm* — Collard & Roe, P.C.; William Collard

(57) ABSTRACT

A display substrate including a first display area including a plurality of first sub-pixels, a plurality of second sub-pixels and a plurality of third sub-pixels, wherein the display substrate includes a plurality of first pixel groups each of which includes two third sub-pixels, one first sub-pixel and one second sub-pixel, the two third sub-pixels are arranged adjacent to each other along a first direction, the one first sub-pixel and the one second sub-pixel are adjacent to at least one of the two third sub-pixels, located on both sides of a straight line passing centers of the two third sub-pixels, and arranged along a second direction different from the first
(Continued)

direction; a size of the first sub-pixel and the second sub-pixel in the second direction is smaller than a size of the first sub-pixel and the second sub-pixel in the first direction, respectively.

15 Claims, 16 Drawing Sheets

Related U.S. Application Data continuation-in-part of application No. 16/492,930, filed as application No. PCT/CN2018/124890 on Dec. 28, 2018, now Pat. No. 10,943,955, said application No. 17/108,691 is a continuation-in-part of application No. 16/234,777, filed on Dec. 28, 2018, now Pat. No. 10,854,684, which is a continuation-in-part of application No. 15/578,481, filed as application No. PCT/CN2017/075957 on Mar. 8, 2017, now abandoned, said application No. 16/234,777 is a continuation-in-part of application No. 15/536,347, filed as application No. PCT/CN2016/081097 on May 5, 2016, now Pat. No. 10,274,654.

(30) Foreign Application Priority Data

| Feb. 9, 2018 | (CN) | 201810135947.1 |
| Feb. 9, 2018 | (CN) | 201810135948.6 |
| Feb. 9, 2018 | (CN) | 201810136335.4 |
| Feb. 9, 2018 | (CN) | 201810137012.7 |
| Feb. 9, 2018 | (CN) | 201810137014.6 |
| Feb. 9, 2018 | (CN) | 201810137016.5 |
| Dec. 13, 2018 | (CN) | 201811525578.3 |

(51) Int. Cl.
  *G09G 3/20* (2006.01)
  *H10K 59/122* (2023.01)

(52) U.S. Cl.
  CPC . *G02F 2201/52* (2013.01); *G09G 2300/0452* (2013.01); *H10K 59/122* (2023.02)

(56) References Cited

U.S. PATENT DOCUMENTS

| 5,113,274 A | 5/1992 | Takahashi |
| 5,341,153 A | 8/1994 | Benzschawel |
| 6,681,053 B1 | 1/2004 | Zhu |
| 6,768,482 B2 | 7/2004 | Asano |
| 6,950,115 B2 | 9/2005 | Brown Elliott |
| 7,123,277 B2 | 10/2006 | Brown Elliott et al. |
| 7,525,526 B2 | 4/2009 | Brown Elliott et al. |
| 7,663,299 B2 | 2/2010 | Chao |
| 7,718,452 B2 | 5/2010 | Sato et al. |
| 7,733,359 B1 | 6/2010 | Hagge |
| 8,159,508 B2 | 4/2012 | Lee |
| 8,207,924 B2 | 6/2012 | Horiuchi et al. |
| 8,330,352 B2 | 12/2012 | Sung et al. |
| 8,363,072 B2 | 1/2013 | Hong |
| 8,446,435 B2 | 5/2013 | Tomizawa |
| 8,754,913 B2 | 6/2014 | Hwang |
| 8,994,015 B2 | 3/2015 | Pyon et al. |
| 9,337,241 B2 | 5/2016 | Lee et al. |
| 9,343,511 B1 | 5/2016 | Feng |
| 9,424,771 B2 | 8/2016 | Gong |
| 9,542,875 B2 | 1/2017 | Yang et al. |
| 9,570,706 B2 | 2/2017 | Yim et al. |
| 9,589,492 B2 | 3/2017 | Feng |
| 9,647,039 B1 | 5/2017 | Wang et al. |
| 9,691,317 B2 | 6/2017 | Li |
| 9,697,760 B2 | 7/2017 | Wang |
| 9,704,926 B2 | 7/2017 | Kim |
| 9,734,753 B2 | 8/2017 | Li et al. |
| 9,818,803 B2 | 11/2017 | Lee |
| 9,871,085 B2 | 1/2018 | Cho et al. |
| 9,905,604 B2 | 2/2018 | Murata |
| 9,941,334 B2 | 4/2018 | Hsu et al. |
| 9,946,123 B2 | 4/2018 | Huangfu et al. |
| 9,972,256 B2 | 5/2018 | Kang et al. |
| 9,984,624 B2 | 5/2018 | Takahashi et al. |
| 9,995,952 B2 | 6/2018 | Chen |
| 10,026,785 B2 | 7/2018 | Bai et al. |
| 10,068,541 B2 | 9/2018 | Sakaigawa |
| 10,141,380 B2 | 11/2018 | Chung et al. |
| 10,147,351 B2 | 12/2018 | Yang et al. |
| 10,181,499 B2 | 1/2019 | Jo et al. |
| 10,210,787 B2 | 2/2019 | Jin |
| 10,224,380 B2 | 3/2019 | Hsu et al. |
| 10,274,654 B2 | 4/2019 | Jin et al. |
| 10,283,086 B1 | 5/2019 | Su et al. |
| 10,373,541 B2 | 8/2019 | Lee et al. |
| 10,504,419 B2 | 12/2019 | Xi et al. |
| 10,504,483 B2 | 12/2019 | Chen et al. |
| 10,520,775 B2 | 12/2019 | You et al. |
| 10,565,918 B2 | 2/2020 | Wu et al. |
| 10,579,173 B2 | 3/2020 | Xu et al. |
| 10,629,656 B2 | 4/2020 | Jo et al. |
| 10,672,318 B2 | 6/2020 | Lee et al. |
| 10,699,642 B2 | 6/2020 | Ma et al. |
| 10,784,445 B2 | 9/2020 | Wang et al. |
| 10,840,307 B2 | 11/2020 | Gu et al. |
| 10,854,684 B2 | 12/2020 | Huangfu et al. |
| 10,861,905 B2 | 12/2020 | Wang |
| 10,867,545 B2 | 12/2020 | Kirisken |
| 10,902,789 B2 | 1/2021 | Park |
| 10,903,281 B2 | 1/2021 | Chung et al. |
| 10,909,901 B2 | 2/2021 | Wu et al. |
| 10,909,904 B2 | 2/2021 | Kim |
| 10,923,077 B2 | 2/2021 | Matsueda |
| 10,943,955 B2 | 3/2021 | Wang et al. |
| 10,953,191 B2 | 3/2021 | Mok et al. |
| 10,971,555 B2 | 4/2021 | Liu et al. |
| 10,991,768 B2 | 4/2021 | Li et al. |
| 11,004,905 B2 | 5/2021 | Sun et al. |
| 11,043,539 B2 | 6/2021 | Jo et al. |
| 11,062,637 B2 | 7/2021 | Jeong et al. |
| 11,069,286 B2 | 7/2021 | Tan et al. |
| 11,233,096 B2 | 1/2022 | Huangfu et al. |
| 11,238,816 B2 | 2/2022 | Huangfu et al. |
| 11,264,430 B2 | 3/2022 | Huangfu et al. |
| 11,462,591 B2 | 10/2022 | Liu et al. |
| 2005/0018110 A1 | 1/2005 | Liu |
| 2005/0041188 A1 | 2/2005 | Yamazaki |
| 2007/0205423 A1 | 2/2007 | Yamazaki |
| 2007/0290973 A1 | 12/2007 | Wei |
| 2008/0001525 A1* | 1/2008 | Chao ............... H10K 59/353 313/503 |
| 2008/0224968 A1 | 9/2008 | Kashiwabara |
| 2008/0225026 A1 | 9/2008 | Uchino et al. |
| 2008/0231554 A1* | 9/2008 | Lee ............... H10K 59/352 345/63 |
| 2009/0079351 A1 | 3/2009 | Choi et al. |
| 2009/0121983 A1 | 5/2009 | Sung et al. |
| 2009/0128900 A1 | 5/2009 | Grasnick |
| 2009/0302331 A1 | 12/2009 | Smith et al. |
| 2010/0033084 A1 | 2/2010 | Ko et al. |
| 2010/0289732 A1 | 11/2010 | Ina et al. |
| 2011/0025723 A1 | 2/2011 | Kim |
| 2011/0128262 A1 | 6/2011 | Chaji et al. |
| 2011/0234550 A1 | 9/2011 | Hong et al. |
| 2011/0260951 A1* | 10/2011 | Hwang ............ G02F 1/134336 345/55 |
| 2011/0260952 A1* | 10/2011 | Hwang ............ G02F 1/134336 345/55 |
| 2011/0291549 A1 | 12/2011 | Kim et al. |
| 2011/0291550 A1 | 12/2011 | Kim et al. |
| 2012/0025182 A1 | 2/2012 | Umeda et al. |
| 2012/0039034 A1 | 2/2012 | Jepsen et al. |
| 2012/0092238 A1 | 4/2012 | Hwang et al. |
| 2012/0313844 A1 | 12/2012 | Im et al. |

(56) References Cited

U.S. PATENT DOCUMENTS

| | | | |
|---|---|---|---|
| 2013/0234917 A1* | 9/2013 | Lee | H10K 59/352 345/82 |
| 2014/0003045 A1 | 1/2014 | Lee et al. | |
| 2014/0071030 A1 | 3/2014 | Lee | |
| 2014/0071175 A1 | 3/2014 | Yang et al. | |
| 2014/0125717 A1 | 5/2014 | Uchino et al. | |
| 2014/0145586 A1 | 5/2014 | Choi | |
| 2014/0198479 A1 | 7/2014 | Chao et al. | |
| 2014/0220715 A1 | 8/2014 | Kang | |
| 2014/0226323 A1 | 8/2014 | Huang et al. | |
| 2014/0252321 A1 | 9/2014 | Pyon et al. | |
| 2014/0284570 A1 | 9/2014 | Jinta et al. | |
| 2014/0292622 A1 | 10/2014 | Lee | |
| 2014/0346537 A1 | 11/2014 | Xi | |
| 2015/0008820 A1 | 1/2015 | Lee | |
| 2015/0015465 A1 | 1/2015 | Gong | |
| 2015/0015466 A1 | 1/2015 | Feng | |
| 2015/0021637 A1 | 1/2015 | Ahn et al. | |
| 2015/0062140 A1 | 3/2015 | Levantovsky et al. | |
| 2015/0102320 A1 | 4/2015 | Jung | |
| 2015/0162391 A1 | 6/2015 | Kim | |
| 2015/0162394 A1 | 6/2015 | Tokuda et al. | |
| 2015/0200237 A1 | 7/2015 | Yim et al. | |
| 2015/0270317 A1 | 9/2015 | Lee et al. | |
| 2015/0310821 A1 | 10/2015 | Kim et al. | |
| 2015/0311264 A1 | 10/2015 | Shen et al. | |
| 2015/0311265 A1 | 10/2015 | Matsueda et al. | |
| 2015/0364525 A1 | 12/2015 | Lin et al. | |
| 2015/0379916 A1 | 12/2015 | Guo et al. | |
| 2016/0019825 A1 | 1/2016 | Guo et al. | |
| 2016/0027360 A1 | 1/2016 | Li | |
| 2016/0049438 A1 | 2/2016 | Murata | |
| 2016/0078807 A1 | 3/2016 | Sun et al. | |
| 2016/0104413 A1* | 4/2016 | Matsueda | G09G 3/3225 345/694 |
| 2016/0121073 A1 | 5/2016 | Mok et al. | |
| 2016/0125807 A1 | 5/2016 | Wang | |
| 2016/0126295 A1 | 5/2016 | Sato | |
| 2016/0126296 A1 | 5/2016 | Feng | |
| 2016/0126298 A1 | 5/2016 | Chen | |
| 2016/0133181 A1 | 5/2016 | Nakamura | |
| 2016/0155781 A1 | 6/2016 | Chaji | |
| 2016/0163247 A1 | 6/2016 | Lee et al. | |
| 2016/0171918 A1 | 6/2016 | Kim et al. | |
| 2016/0190523 A1 | 6/2016 | Kim et al. | |
| 2016/0196776 A1 | 7/2016 | Yang et al. | |
| 2016/0203748 A1 | 7/2016 | Matsueda et al. | |
| 2016/0240593 A1 | 8/2016 | Gu et al. | |
| 2016/0253943 A1 | 9/2016 | Wang | |
| 2016/0254476 A1 | 9/2016 | Park | |
| 2016/0260401 A1 | 9/2016 | Sakaigawa | |
| 2016/0293678 A1 | 10/2016 | Wang | |
| 2016/0300892 A1 | 10/2016 | Bai et al. | |
| 2016/0321993 A1 | 11/2016 | Choi et al. | |
| 2016/0343284 A1 | 11/2016 | Sun | |
| 2016/0351119 A1 | 12/2016 | Ono | |
| 2016/0357076 A1 | 12/2016 | Huangfu et al. | |
| 2016/0358536 A1 | 12/2016 | Li et al. | |
| 2016/0358985 A1 | 12/2016 | Bai et al. | |
| 2016/0370919 A1 | 12/2016 | Xu et al. | |
| 2016/0379571 A1 | 12/2016 | Kim et al. | |
| 2017/0039924 A1 | 2/2017 | Jin | |
| 2017/0110087 A1 | 4/2017 | Chen et al. | |
| 2017/0133440 A1 | 5/2017 | Wang et al. | |
| 2017/0179389 A1 | 6/2017 | Cho et al. | |
| 2017/0193880 A1 | 7/2017 | Lee et al. | |
| 2017/0270843 A1 | 9/2017 | Lee et al. | |
| 2017/0278905 A1 | 9/2017 | Hsu et al. | |
| 2017/0294491 A1 | 10/2017 | Jo et al. | |
| 2017/0317150 A1 | 11/2017 | Chung et al. | |
| 2017/0352710 A1 | 12/2017 | Hong et al. | |
| 2018/0012547 A1 | 1/2018 | Li et al. | |
| 2018/0030890 A1 | 2/2018 | Roe et al. | |
| 2018/0059458 A1 | 3/2018 | Chen | |
| 2018/0088260 A1 | 3/2018 | Jin et al. | |
| 2018/0090549 A1 | 3/2018 | Hamada et al. | |
| 2018/0097043 A1 | 4/2018 | Song | |
| 2018/0175121 A1 | 6/2018 | Ji et al. | |
| 2018/0182828 A1 | 6/2018 | Kim | |
| 2018/0247984 A1 | 8/2018 | Wang et al. | |
| 2018/0292695 A1 | 10/2018 | You et al. | |
| 2018/0308412 A1 | 10/2018 | Wu et al. | |
| 2018/0308430 A1 | 10/2018 | Xu | |
| 2018/0308907 A1 | 10/2018 | Jin et al. | |
| 2018/0355466 A1 | 12/2018 | Mu | |
| 2019/0004648 A1 | 1/2019 | Xu et al. | |
| 2019/0011830 A1 | 1/2019 | Ji | |
| 2019/0035859 A1 | 1/2019 | Kang et al. | |
| 2019/0066564 A1 | 2/2019 | Tan | |
| 2019/0073941 A1 | 3/2019 | Xi et al. | |
| 2019/0081113 A1 | 3/2019 | Gu et al. | |
| 2019/0088726 A1 | 3/2019 | Zhang | |
| 2019/0096962 A1 | 3/2019 | Han et al. | |
| 2019/0115399 A1 | 4/2019 | Jo et al. | |
| 2019/0131589 A1 | 5/2019 | Matsueda et al. | |
| 2019/0139513 A1 | 5/2019 | Su et al. | |
| 2019/0140030 A1* | 5/2019 | Huangfu | H10K 59/122 |
| 2019/0206341 A1 | 7/2019 | Liao et al. | |
| 2019/0237518 A1 | 8/2019 | Sun et al. | |
| 2019/0296093 A1 | 9/2019 | Liu et al. | |
| 2019/0326365 A1 | 10/2019 | Jin | |
| 2019/0340970 A1 | 11/2019 | Kirisken | |
| 2019/0385534 A1 | 12/2019 | Park | |
| 2020/0013833 A1 | 1/2020 | Wang et al. | |
| 2020/0035172 A1 | 1/2020 | Chen | |
| 2020/0043990 A1 | 2/2020 | Huangfu et al. | |
| 2020/0051485 A1 | 2/2020 | Liu et al. | |
| 2020/0058713 A1 | 2/2020 | Zhang | |
| 2020/0119107 A1 | 4/2020 | Liu et al. | |
| 2020/0152726 A1 | 5/2020 | Hong et al. | |
| 2020/0176524 A1 | 6/2020 | Jo et al. | |
| 2020/0258441 A1 | 8/2020 | Zhang et al. | |
| 2020/0265760 A1 | 8/2020 | Song et al. | |
| 2020/0312942 A1 | 10/2020 | Yang et al. | |
| 2020/0328259 A1 | 10/2020 | Joe | |
| 2020/0357325 A1 | 11/2020 | Zhao et al. | |
| 2020/0357862 A1 | 11/2020 | Wang et al. | |
| 2020/0365085 A1* | 11/2020 | Yang | G09G 3/3258 |
| 2021/0027679 A1 | 1/2021 | Kwon et al. | |
| 2021/0035484 A1 | 2/2021 | Matsueda et al. | |
| 2021/0091145 A1 | 3/2021 | Huangfu et al. | |
| 2021/0233969 A1 | 7/2021 | Sun et al. | |
| 2021/0335297 A1* | 10/2021 | Huangfu | G09G 3/3607 |
| 2022/0028348 A1 | 1/2022 | Huangfu et al. | |

FOREIGN PATENT DOCUMENTS

| | | |
|---|---|---|
| CN | 101266753 A | 9/2008 |
| CN | 101582241 A | 11/2009 |
| CN | 101339729 B | 6/2010 |
| CN | 102201430 A | 9/2011 |
| CN | 101582241 B | 10/2011 |
| CN | 103681754 A | 3/2014 |
| CN | 103777393 A | 5/2014 |
| CN | 104036722 A | 9/2014 |
| CN | 104037202 A | 9/2014 |
| CN | 104051493 A | 9/2014 |
| CN | 104269411 A | 1/2015 |
| CN | 104282727 A | 1/2015 |
| CN | 104332486 A | 2/2015 |
| CN | 104377229 A | 2/2015 |
| CN | 104465714 A | 3/2015 |
| CN | 104576695 A | 4/2015 |
| CN | 104597655 A | 5/2015 |
| CN | 104637987 A | 5/2015 |
| CN | 104701341 A | 6/2015 |
| CN | 104795431 A | 7/2015 |
| CN | 104835832 A | 8/2015 |
| CN | 104882464 A | 9/2015 |
| CN | 105280139 A | 1/2016 |
| CN | 204991022 U | 1/2016 |
| CN | 204991023 U | 1/2016 |
| CN | 205231065 U | 5/2016 |
| CN | 205355055 U | 6/2016 |

(56) References Cited

FOREIGN PATENT DOCUMENTS

| | | |
|---|---|---|
| CN | 105741774 A | 7/2016 |
| CN | 105789253 A | 7/2016 |
| CN | 105826349 A | 8/2016 |
| CN | 105938266 A | 9/2016 |
| CN | 205608350 U | 9/2016 |
| CN | 106094334 A | 11/2016 |
| CN | 205845956 U | 12/2016 |
| CN | 106293244 A | 1/2017 |
| CN | 106297659 A | 1/2017 |
| CN | 106298865 A | 1/2017 |
| CN | 106601167 A | 4/2017 |
| CN | 106782307 A | 5/2017 |
| CN | 206163494 U | 5/2017 |
| CN | 104597655 B | 6/2017 |
| CN | 106935618 A | 7/2017 |
| CN | 106935630 A | 7/2017 |
| CN | 106991957 A | 7/2017 |
| CN | 107016964 A | 8/2017 |
| CN | 107248378 A | 10/2017 |
| CN | 107256695 A | 10/2017 |
| CN | 107275359 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 108198527 A | 6/2018 |
| CN | 108258013 A | 7/2018 |
| CN | 207781607 U | 8/2018 |
| CN | 207781608 U | 8/2018 |
| CN | 108493221 A | 9/2018 |
| CN | 207883217 U | 9/2018 |
| CN | 108649000 A | 10/2018 |
| CN | 208172438 U | 11/2018 |
| CN | 208172439 U | 11/2018 |
| CN | 109491158 A | 3/2019 |
| CN | 107248393 B | 4/2019 |
| CN | 109559679 A | 4/2019 |
| EP | 2 423 911 A2 | 2/2012 |
| EP | 2 680 310 A1 | 1/2014 |
| EP | 3 270 216 A1 | 1/2018 |
| EP | 3 306 598 A1 | 4/2018 |
| EP | 3751611 A1 | 12/2020 |
| IN | 104362170 A | 2/2015 |
| JP | H0945266 A | 2/1997 |
| JP | 2002-221917 A | 8/2002 |
| JP | 2004207217 A | 7/2004 |
| JP | 2005062416 A | 3/2005 |
| JP | 2008-015521 A | 1/2008 |
| JP | 2008197491 A | 8/2008 |
| JP | 2008225179 A | 9/2008 |
| JP | 2009533810 A | 9/2009 |
| JP | 2010002531 A | 1/2010 |
| JP | 2010-212814 A | 9/2010 |
| JP | 2014225329 A | 12/2014 |
| JP | 2015138955 A | 7/2015 |
| JP | 2016-090991 A | 5/2016 |
| JP | 2016075868 A | 5/2016 |
| JP | 2016091918 A | 5/2016 |
| JP | 2016130780 A | 7/2016 |
| JP | 2016537688 A | 12/2016 |
| JP | 2018198198 A | 12/2018 |
| KR | 10-2009-0049515 A | 5/2009 |
| KR | 10-2011-0108050 A | 10/2011 |
| KR | 20120063049 A | 6/2012 |
| KR | 10-1347995 B1 | 1/2014 |
| KR | 10-2015-0006668 A | 1/2015 |
| KR | 10-2016-0051511 A | 5/2016 |
| KR | 10-2017-0116556 A | 10/2017 |
| RU | 2 453 879 C2 | 6/2012 |
| RU | 2 721 902 C1 | 5/2020 |
| WO | 2007/088656 A1 | 8/2007 |
| WO | 2012/166162 A1 | 12/2012 |
| WO | 2014/136149 A1 | 9/2014 |
| WO | 2016/192241 A1 | 12/2016 |
| WO | 2017/140038 A1 | 8/2017 |
| WO | 2018/014562 A1 | 1/2018 |
| WO | 2019084932 A1 | 5/2019 |
| WO | 2019134514 A1 | 7/2019 |
| WO | 2019134522 A1 | 7/2019 |
| WO | 2019/153948 A1 | 8/2019 |
| WO | 2019153949 A1 | 8/2019 |
| WO | 2020/119132 A1 | 6/2020 |
| WO | 2020124693 A1 | 6/2020 |
| WO | 2020/133885 A1 | 7/2020 |

OTHER PUBLICATIONS

Extended European Search Report in European Application No. 19832268.7 dated Oct. 25, 2022.
Japanese Office Action in Japanese Application No. 2020-536078 dated Nov. 28, 2022 with English translation.
Japanese Office Action in Japanese Application No. 2019-549456 dated Nov. 29, 2022 with English translation.
Japanese Office Action in Japanese Application No. 2019-543028 dated Nov. 29, 2022 with English translation.
Japanese Office Action in Japanese Application No. 2020-535989 dated Nov. 30, 2022 with English translation.
Notice of Allowance in U.S. Appl. No. 16/630,496, dated Mar. 26, 2021.
Notice of Allowance in U.S. Appl. No. 16/600,316, dated Apr. 14, 2021.
English translation of Extended European Search Report in EP Application No. 21152119.0 mailed May 11, 2021.
Indian Office Action in Indian Application No. 202017026082 dated May 25, 2021 with English translation.
U.S. Non-Final Office Action in U.S. Appl. No. 16/621,904 dated Aug. 2, 2021.
Park et al., Luminance Uniformity of Large-Area OLEDs With an Auxiliary Metal Electrode, Journal of Display Technology, Downloaded on Jun. 2, 2021 from IEEE Xplore, Aug. 2009, pp. 306-311, vol. 5, No. 8.
Extended European Search Report in European Application No. 19933217.2 dated Jul. 5, 2022.
Extended European Search Report in European Application No. EP18905693.0 dated Oct. 1, 2021.
Extended European Search Report in European Application No. EP18905189.9 dated Oct. 19, 2021.
Indian Office Action in Indian Application No. 202017027785 dated Aug. 19, 2021 with English translation.
Korean Office Action in the Written Decision on Dismissal of Amendment in Korean Application No. 10-2019-7027773 dated Aug. 24, 2021 with English translation.
U.S. Office Action in U.S. Appl. No. 16/626,559 dated Aug. 30, 2021.
U.S. Office Action in U.S. Appl. No. 17/497,630 dated May 12, 2022.
U.S. Office Action in U.S. Appl. No. 16/621,904 dated Mar. 15, 2022.
Chinese Office Action in Chinese Application No. 201680082630.5 dated Apr. 1, 2022.
U.S. Notice of Allowance in U.S. Appl. No. 16/755,970 dated May 6, 2022.
Indian Office Action in Indian Application No. 202027048001 dated Dec. 6, 2021.
U.S. Office Action in U.S. Appl. No. 16/622,045 dated Dec. 21, 2021.
Korean Office Action in Korean Application No. 2021-7030323 dated Jan. 25, 2022.
Extended European Search Report in European Application No. 18903035.6 dated Nov. 8, 2021.
Notice of Allowance in U.S. Appl. No. 17/108,691 dated Sep. 13, 2021.
Candice H. Brown Elliot, "Reducing Pixel Count Without Reducing Image Quality", Information display, vol. 1999 (12): 22-25, 1999 (4 pages).

(56) References Cited

OTHER PUBLICATIONS

Lu Fang et al., "Subpixel Rendering: From Font Rendering to Image Subsampling", IEEE Signal Processing Magazine, vol. 2013 (5): 177-182 and 189, 2013 (7 pages).
Dean S. Messing, Scott Daly, "Improved Display Resolution of Subsampled Colour Images Using Subpixel Addressing", IEEE ICIP 2002: I-625-628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
Korean Office Action in Korean Application No. 10-2017-7022698, mailed May 29, 2019 with English translation.
Korean Notice of Allowance in Korean Application No. 10-2017-7022698, mailed Mar. 6, 2020.
First Office Action in U.S. Appl. No. 15/536,347 dated Aug. 28, 2018.
First Office Action in U.S. Appl. No. 15/578,481 dated Feb. 1, 2019.
Non-Final Office Action in U.S. Appl. No. 15/578,481 dated Jul. 11, 2019.
Notice of Allowance in U.S. Appl. No. 16/234,777 dated Sep. 1, 2020.
First Office Action in U.S. Appl. No. 16/492,930 dated Jul. 24, 2020.
First Office Action in U.S. Appl. No. 16/600,316 dated Oct. 6, 2020.
First Office Action in U.S. Appl. No. 16/621,918 dated Sep. 29, 2020.
Chinese Office Action in Chinese Application No. 201810135947.1, mailed Mar. 3, 2020 with English translation.
English translation of Extended European Search Report in EP Application No. 17768339.8 mailed Dec. 6, 2019.
Indian Office Action in Indian Application No. 201717038562, mailed Oct. 15, 2019.
Korean Office Action in Korean Application No. 10-2019-7024785, mailed Jul. 30, 2020 with English translation.
International Search Report of PCT/CN2016/081097 in Chinese, mailed Nov. 16, 2016, with English translation.
International Preliminary Report on Patentability of PCT/CN2016/081097, issuance date Aug. 21, 2018 and English Translation of the Written Opinion of the International Searching Authority of PCT/CN2016/081097, mailed Nov. 16, 2016.
International Search Report of PCT/CN2017/075957 in Chinese, mailed Jun. 8, 2017.
International Preliminary Report on Patentability of PCT/CN2017/075957, issuance date Jan. 22, 2019 and Written Opinion of the International Searching Authority of PCT/CN2017/075957, mailed Jun. 8, 2017.
International Preliminary Report on Patentability of PCT/CN2018/124404, issuance date Aug. 11, 2020 and English Translation of the Written Opinion of the International Searching Authority of PCT/CN2018/124404, mailed Mar. 14, 2019.
International Search Report of PCT/CN2018/124404 in Chinese, mailed Mar. 14, 2019, with English translation.
International Preliminary Report on Patentability of PCT/CN2018/124445, issuance date Aug. 11, 2020 and English Translation of the Written Opinion of the International Searching Authority of PCT/CN2018/124445, mailed Mar. 19, 2019.
International Search Report of PCT/CN2018/124445 in Chinese, mailed Mar. 21, 2019, with English translation.
International Search Report of PCT/CN2018/124881 in Chinese, mailed Mar. 26, 2019, with English translation.
International Preliminary Report on Patentability of PCT/CN2018/124881, issuance date Aug. 11, 2020 and English Translation of the Written Opinion of the International Searching Authority of PCT/CN2018/124881, mailed Mar. 26, 2019.
International Preliminary Report on Patentability of PCT/CN2018/124884, issuance date Aug. 11, 2020 and English Translation of the Written Opinion of the International Searching Authority of PCT/CN2018/124884, mailed Mar. 27, 2019.
International Search Report of PCT/CN2018/124884 in Chinese, mailed Mar. 27, 2019, with English translation.
International Search Report of PCT/CN2018/124890 in Chinese, mailed Mar. 27, 2019, with English translation.
International Preliminary Report on Patentability of PCT/CN2018/124890, issuance date Aug. 11, 2020 and English Translation of the Written Opinion of the International Searching Authority of PCT/CN2018/124890, mailed Mar. 27, 2019.
International Search Report of PCT/CN2019/086875 in Chinese, mailed Sep. 25, 2019, with English translation.
Notice of Transmittal of the International Search Report of PCT/CN2019/086875 in Chinese, mailed Sep. 25, 2019.
Written Opinion of the International Searching Authority of PCT/CN2019/086875 in Chinese, mailed Sep. 25, 2019.
International Search Report of PCT/CN2019/097765, mailed Oct. 28, 2019.
Written Opinion of the International Searching Authority of PCT/CN2019/097765, mailed Oct. 28, 2019.
International Search Report of PCT/CN2019/098705 in Chinese, mailed May 6, 2020, with English translation.
Notice of Transmittal of the International Search Report of PCT/CN2019/098705 in Chinese, mailed May 6, 2020.
Written Opinion of the International Searching Authority of PCT/CN2019/098705 in Chinese, mailed May 6, 2020, with English translation.
Notice of Transmittal of the International Search Report of PCT/CN2019/098707 in Chinese, mailed May 9, 2020.
Written Opinion of the International Searching Authority of PCT/CN2019/098707 in Chinese, mailed May 9, 2020, with English translation.
International Search Report of PCT/CN2019/098707 in Chinese, mailed May 9, 2020, with English translation.
Russian Notice of Allowance in Russian Application No. 2019130488, mailed Mar. 18, 2020 with English Translation.
Japanese Office Action in Japanese Application No. 2017-544608, mailed Oct. 12, 2020 with English translation.
Australian Office Action in Australian Application No. 2019279968, mailed Dec. 11, 2020.
Korean Office Action in Korean Application No. 10-2019-7027773, mailed Dec. 25, 2020 with English translation.
U.S. Office Action in U.S. Appl. No. 16/483,210 dated Sep. 22, 2021.
U.S. Office Action in U.S. Appl. No. 16/621,904 dated Feb. 10, 2023.
Japanese Office Action in Japanese Application No. 2019-569438 dated Mar. 27, 2023 with English translation.
Written Opinion of ISR for PCT/CN2018/124386 mailed on Mar. 29, 2019.
International Search Report for PCT/CN2018/124386 Mailed on Mar. 29, 2019.
International Search Report for PCT/CN2018/102754 Mailed on Dec. 5, 2018.
Written Opinion of PCT/CN2018/102754 Mailed on Dec. 6, 2018.
Chinese Office Action in Chinese Application No. 201810137016.5 dated Nov. 30, 2023 with English translation.
European Office Action in European Application No. 18903035.6 dated Nov. 16, 2023.
Chinese Office Action in Chinese Application No. 201810136335.4 dated Nov. 15, 2023 with English translation.
Chinese Office Action in Chinese Application No. 201810137012.7 dated Nov. 30, 2023 with English translation.
U.S. Office Action in U.S. Appl. No. 18/140,699 dated Sep. 11, 2023.
U.S. Office Action in U.S. Appl. No. 16/957,607 dated Apr. 16, 2024.
U.S. Office Action in U.S. Appl. No. 16/957,607 dated Dec. 29, 2023.

* cited by examiner

PIXEL ARRANGEMENT STRUCTURE AND DRIVING METHOD THEREOF, DISPLAY SUBSTRATE AND DISPLAY DEVICE

CROSS REFERENCE TO RELATED APPLICATIONS

This application is a continuation of U.S. Ser. No. 17/108,691 filed on Dec. 1, 2020. The application U.S. Ser. No. 17/108,691 is a continuation in part of U.S. Ser. No. 16/492,930 filed on Sep. 10, 2019 which is a national stage application of international application PCT/CN2018/124890 filed on Dec. 28, 2018, which claims priority from CN201810137012.7 filed on Feb. 9, 2018. The application of U.S. Ser. No. 17/108,691 is also a continuation in part of U.S. Ser. No. 16/234,777 filed on Dec. 28, 2018. The application of U.S. Ser. No. 16/234,777 is a continuation in part of U.S. Ser. No. 15/536,347 filed on Jun. 15, 2017 which is a national stage application of international application PCT/CN2016/081097 filed on May 5, 2016, which claims priority from CN201620127445.0 filed Feb. 18, 2016. The application of U.S. Ser. No. 16/234,777 is also a continuation in part application of Ser. No. 15/578,481 filed on Nov. 30, 2017 which is a national stage application of international application PCT/CN2017/075957 filed on Mar. 8, 2017 which claims priority from CN 201610585894.4 filed on Jul. 22, 2016. The application of U.S. Ser. No. 16/234,777 also claims priority under 35 U.S.C. 119 from the following applications CN 201810135947.1 filed on Feb. 9, 2018, CN 201810137012.7 filed on Feb. 9, 2018, CN 201810136335.4 filed on Feb. 9, 2018, CN 201810135948.6 filed on Feb. 9, 2018, CN 201810137016.5 filed on Feb. 9, 2018, CN 201810137014.6 filed on Feb. 9, 2018, CN 201811525578.3 filed on Dec. 13, 2018. The disclosures of all of these applications hereby incorporated herein by reference in their entirety.

TECHNICAL FIELD

The present disclosure relates to a display substrate.

BACKGROUND

Nowadays, the continuous developments of the display technique has led to higher requirements to the display resolution and the higher display resolution in turn would increase the techniques complexity and cost for preparing and making displays. When the display resolution is at a similar level of the naked-eye resolution, the conventional mode of using three sub-pixels namely red (R), green (G) and blue (B) for defining one pixel briefly may be changed, based on the differences of naked eyes in distinguishing different colored pixels. That is, by sharing some sub-pixels which color have less sensitive resolutions at certain location in different pixels, and using relatively less sub-pixels to simulate the same pixel resolution performance, complexity and cost of the Fine Metal Mask (FMM) techniques is reduced.

SUMMARY

Embodiments of the disclosure provide a pixel arrangement structure, comprising a plurality of repeating units, wherein each of the plurality of repeating units comprises one first sub-pixel, one second sub-pixel, and two third sub-pixels; in each of the plurality of repeating units, the two third sub-pixels are arranged in one of a first direction and a second direction, and the first sub-pixel and the second sub-pixel are arranged in the other one of the first direction and the second direction; the plurality of repeating units are arranged in the first direction to form a plurality of repeating unit groups, the plurality of repeating unit groups are arranged in the second direction; and the first direction and the second direction are different directions.

Embodiments of the disclosure further provide a driving method of the pixel arrangement structure, a display substrate including the pixel arrangement structure and a display device including the display substrate.

BRIEF DESCRIPTION OF THE DRAWINGS

In order to illustrate embodiments of the disclosure clearly, drawings required for a description of the embodiments will be described briefly. Apparently, the drawings in the following description are only some embodiments of the present disclosure, rather than limitations to the present disclosure.

DETAILED DESCRIPTION

Solutions in the embodiments of the present disclosure will be described clearly and completely below in conjunction with the accompanying drawings of the embodiments of the present disclosure. It is obvious that the described embodiments are only part of the embodiments of the present disclosure, but not all the embodiments. Based on the embodiments of the present disclosure, other embodiments obtained by those ordinary skilled in the art without creative labors would belong to the protection scope of the present disclosure.

Figure 1:
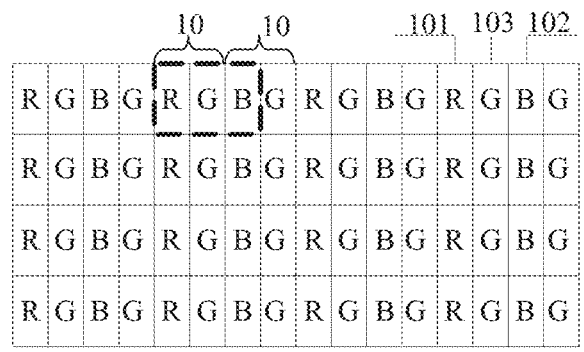
FIG. 1 is a diagram illustrating the arrangement of red, green and blue sub-pixels in the pixel arrangement structure according to some related arts.

With reference to FIG. 1, in some related arts, in the row direction, red, green, blue, and green sub-pixels are arranged in cycles, wherein in each pixel 10, there is an independent green sub-pixel 103, a red sub-pixel 101 and a blue sub-pixel 102 located on both sides and shared by the adjacent pixels 10, thus the sub-pixel density in the direction of rows is two times of the pixel density, and the sub-pixel density in the direction of columns is the same as the pixel density.

With reference to FIG. 1, one red sub-pixel 101 and one green sub-pixel 103 form a pixel 10, and one blue sub-pixel 102 and one green sub-pixel 103 form a pixel 10. The pixel here only includes two sub-pixels with different colors. It is necessary for the pixel to borrow or share a sub-pixel of other pixels to realize color display. Therefore, the pixel 10 here may be called virtual pixel.

Accordingly, although the same resolution ratio may be achieved with a few sub-pixels, in the direction of rows the sub-pixel density is still equal two times of the pixel density, which results in high requirements to the FMM technique level.

An embodiment according to the present disclosure provides a pixel arrangement structure, comprising a plurality of repeating units, each repeating unit comprising one first sub-pixel, one second sub-pixel and two third sub-pixels.

The four sub-pixels of each repeating unit constitute two pixels, the first sub-pixel and the second sub-pixel being shared by the two pixels. In a first direction of the pixel array, the sub-pixel density is equal to 1.5 times of the pixel density, in a second direction of the pixel array, the sub-pixel density is equal to 1.5 times of the pixel density. The first direction and the second direction are different directions.

It is to be noted that, in the first aspect, the pixel arrangement structure according to the embodiments of the present disclosure can be applied to any display device composed of three sub-pixels such as red, green and blue sub-pixels. Examples of the display device may be Liquid Crystal Display (LCD) and Organic Light-Emitting Diode (OLED) etc.

In the second aspect, since the first sub-pixel and the second sub-pixel of each pixel are shared by two pixels, the pixels according to the embodiments of the present disclosure cannot be considered as real pixels in a strict definition, where a pixel is defined by a complete one first sub-pixel, one second sub-pixel and one third sub-pixel. Therefore, the pixels of the present disclosure may be called virtual pixels.

Since the first sub-pixel and the second sub-pixel are shared by two pixels, the boundary of each virtual pixel is blurry. Thus, the shape of each pixel is not defined by the embodiments of the present disclosure.

In the third aspect, it is known to a person skilled in the art that, based on the pixel arrangement structure, the pixels and the first sub-pixel, the second sub-pixel and the third sub-pixels in each pixel may be distributed evenly.

In the fourth aspect, the first and second directions as illustrated in the accompanying drawings are only illustrations in a general view, that is, in order to satisfy that sub-pixel density is 1.5 times of pixel density and pixels and each sub-pixel in pixels are evenly distributed in overall, the first direction in a closer view might not be a completely straight line but wavy lines, the same applies to the second direction.

The first direction and the second direction may be for example two directions being perpendicular to each other in the same plane, such as the plane where the pixels are arranged.

Embodiments of the present disclosure provide a pixel arrangement structure, since the four sub-pixels in each repeating unit may form two pixels, wherein the first sub-pixel and the second sub-pixel are shared by two pixels, in the first direction of the pixel array, the sub-pixel density is 1.5 times of the pixel density, in the second direction of the pixel array, the sub-pixel density is 1.5 times of the pixel density. Compared to the technologies in the art where in one direction, the sub-pixel density is two times of the pixel density and in another direction, the sub-pixel density is equal to the pixel density, the embodiments of the present disclosure reduces the sub-pixel density while balancing the quantity of the sub-pixels in two directions, thus may avoid having too many sub-pixels in one particular direction. Thus when the pixel arrangement structure is applied to a display panel, the FMM techniques complexity for making the pixels of the display panel may be reduced in overall.

In an example, the first sub-pixel is red sub-pixel, the second sub-pixel is blue sub-pixel, and the third sub-pixel is green sub-pixel.

In other words, the pixel arrangement structure comprises a plurality of repeating units, wherein each repeating unit comprises one first sub-pixel, one blue sub-pixel and two green sub-pixels; the four sub-pixels of each repeating unit constitute two pixels, the red sub-pixel and the blue sub-pixel being shared by the two pixels; in a first direction of the pixel array, the sub-pixel density is equal to 1.5 times of the pixel density, in a second direction of the pixel array, the sub-pixel density is equal to 1.5 times of the pixel density; wherein, the first direction and the second direction are different directions.

It is to be noted that, in the first aspect, since the red sub-pixel and the blue sub-pixel of each pixel are shared by two pixels, the pixels according to the embodiments of the present disclosure cannot be considered as real pixels in a strict definition, where a pixel is defined by a complete one red sub-pixel, one green sub-pixel and one blue sub-pixel. Therefore, the pixels of the present disclosure may be called virtual pixels.

Since the red sub-pixel and the blue sub-pixel are shared by two pixels, the boundary of each virtual pixel is blurry. Thus, the shape of each pixel is not defined by the embodiments of the present disclosure.

In the second aspect, it is known to a person skilled in the art that, in the case of high resolution, the green sub-pixels play a critical role in deciding the perceived luminance central position of each pixel. Thus, based on the embodiments of the present disclosure, the green sub-pixels in each pixel may be in overall distributed evenly.

Since the embodiments of the present disclosure requires that whether in the first direction or in the second direction, the sub-pixel density is 1.5 times of the pixel density, causing difficulties for the green sub-pixels to be distributed with equal space in all the locations. Accordingly, the embodiments of the present disclosure may achieve the even distribution of the green sub-pixels in overall in a range of more than three pixel-spaces by slightly adjusting the relative position of the green sub-pixels in different rows and columns.

Based on this, the red sub-pixels and the blue sub-pixels shared by two adjacent pixels may be evenly distributed as much as possible together with the green sub-pixels.

Figure 2A:
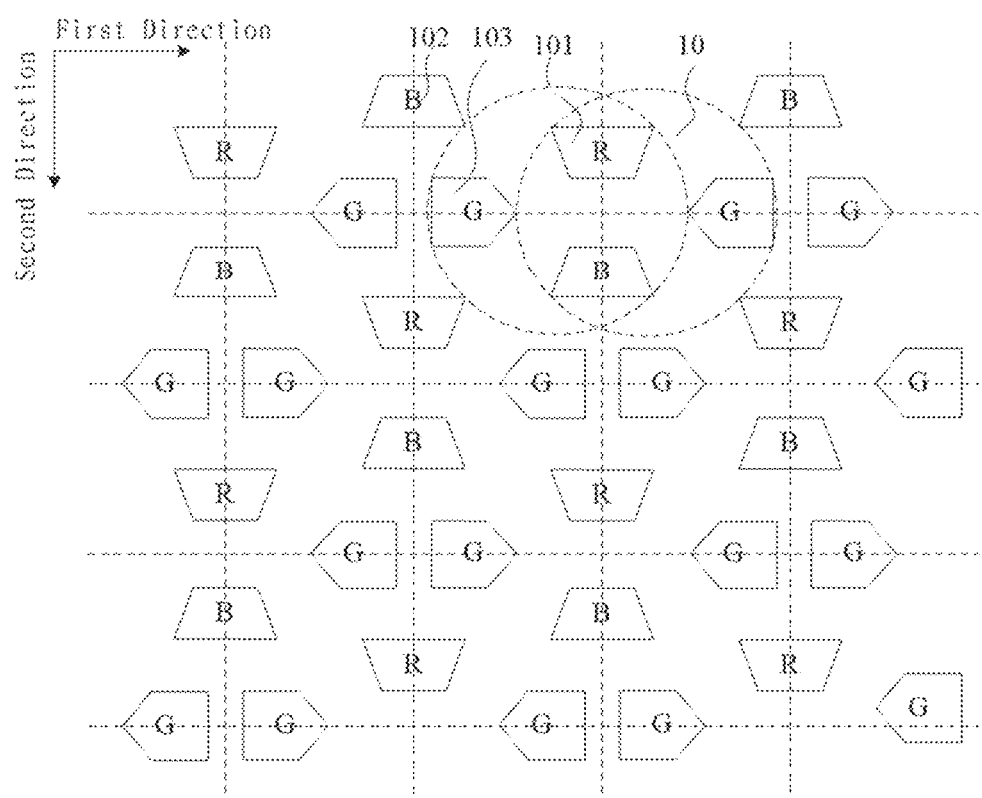
FIG. 2(a) is a first diagram illustrating the arrangement of red, green and blue sub-pixels in the pixel arrangement structure according to an embodiment of the present disclosure.
Figure 2B:
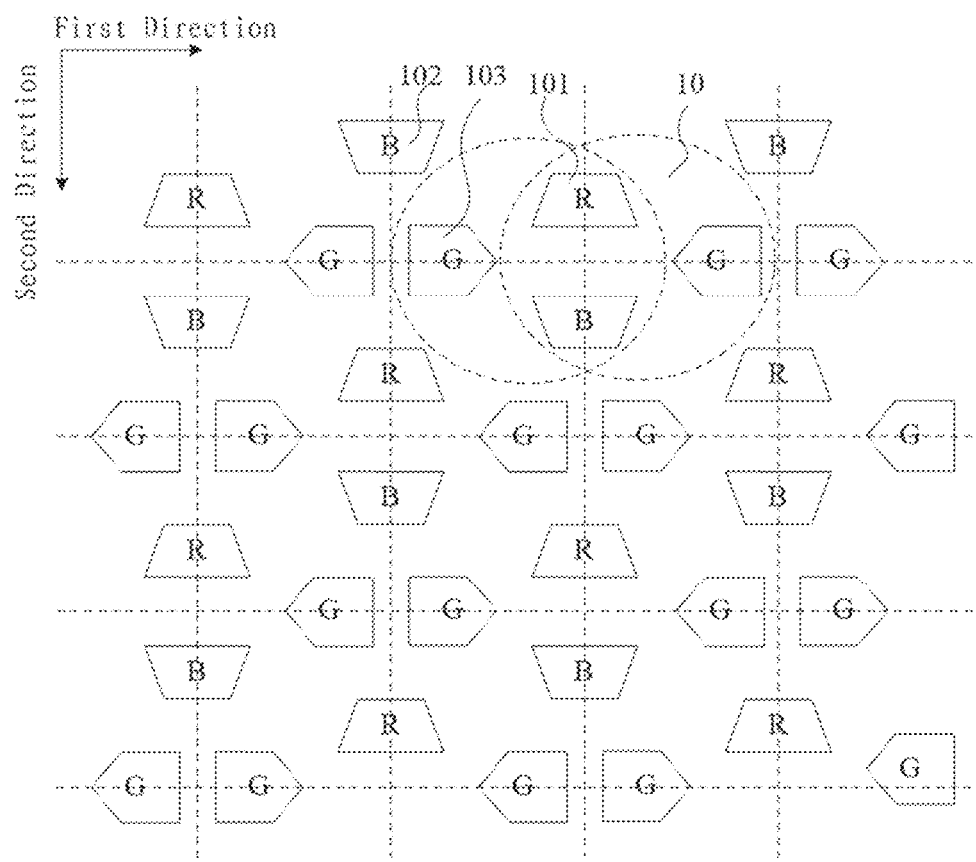
FIG. 2(b) is a second diagram illustrating the arrangement of red, green and blue sub-pixels in the pixel arrangement structure according to an embodiment of the present disclosure.

In an example illustrated in FIG. 2(a) and FIG. 2(b), in the first direction, the green sub-pixels 103 are disposed in pairs and within each pair, two green sub-pixels are adjacent to each other; a red sub-pixel 101 and a blue sub-pixel 102 is disposed between any two adjacent pairs of green sub-pixels 103. For example, the green sub-pixels disposed in pairs, in each of which two sub-pixels being adjacent to each other, forms a plurality of green sub-pixel pairs arranged in the first direction. For example, the two green sub-pixels of each green sub-pixel pair are arranged in the first direction.

With reference to FIG. 2(a) and FIG. 2(b), two adjacent green sub-pixels forming a green sub-pixel pair and one red sub-pixels and one blue sub-pixel arranged at the green sub-pixel pair form a repeating unit. A plurality of repeating units are arranged along the first direction to form a plurality of repeating unit groups. Each dash line in a horizontal direction refers to a center line of a repeating unit group or a repeating unit row formed by repeating units arranged in the first direction. In this embodiment, the red sub-pixel and the blue sub-pixel in each repeating unit are arranged in the second direction, the green sub-pixel pairs are arranged in the first direction. The arrangement of the repeating unit group is not limited in the embodiment. For example, an arrangement way is to arrange the red sub-pixel, the blue sub-pixel and the green sub-pixel pairs sequentially in the first direction, and another arrangement way is to arrange the red sub-pixel and the blue sub-pixel between the green sub-pixel pairs.

In other words, all the green sub-pixels 103 in the first direction are in pairs, within each pair the green sub-pixels are disposed adjacent to each other.

Based on this, in a preferred embodiment, a red sub-pixel 101 and a blue sub-pixel 102 between any two adjacent pairs of green sub-pixels 103 are opposed to each other in the second direction.

Here, as in the first direction, the red sub-pixel 101 and the blue sub-pixel 102 are both disposed between two adjacent pairs of green sub-pixels 103, the requirement that the sub-pixel density is 1.5 times of the pixel density may thus be satisfied. The proportion of the numbers of the red sub-pixels 101, the green sub-pixels 103 and the blue sub-pixels 102 may be 1:2:1.

For example, four sub-pixels are included in a location illustrated by the two dash circles in FIG. 2(a). The four sub-pixels are located in three sub-pixel rows and three sub-pixel columns, respectively. For example, the red sub-pixel is in the first row, the two green sub-pixels are the second row, and the blue sub-pixel is in the third row; accordingly, the green sub-pixel is in the first column, the red sub-pixel and the blue sub-pixel are in the second column, and the green sub-pixel is in the third column. The four sub-pixels may constitute two virtual pixels, i.e. a virtual pixel constituted by one red sub-pixel and one green sub-pixel and a virtual pixel constituted by one blue sub-pixel and one green sub-pixel. That is, sub-pixels in three sub-pixel rows and three sub-pixel columns constitute pixels in two pixel rows and two pixel columns; therefore, the sub-pixel density is 1.5 times of the pixel density both in the row direction and in column direction. For example, repeating units are arranged to form repeating unit rows or repeating unit columns, the rows and the columns are formed by taking the repeating unit as a whole. Each repeating unit itself includes a plurality of sub-pixel rows and a plurality of sub-pixel columns. For example, each repeating unit includes three rows of sub-pixels or three columns of sub-pixels. For example, as illustrated in FIG. 2(a), in each repeating unit, the two green sub-pixels are in a row, one red sub-pixel is in a row, and one blue sub-pixel is in a row.

In some embodiments of the present disclosure, as in the first direction all the green sub-pixels 103 are disposed in pairs in each of which two green sub-pixels are adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side along the first direction, and slight adjustments of the position of the green sub-pixels 103 may permit even distribution of the virtual pixel array. Also, by keeping certain distance between two most adjacent green sub-pixels, it may reduce the complexity of the techniques while guaranteeing the horizontal and vertical lines of the centers of the bright spots to be smooth and continuous (as illustrated in dash lines in FIG. 2(a) and FIG. 2(b)).

For example, as illustrated in FIG. 2(a) and FIG. 2(b), the shape of the red sub-pixels 101 and the blue sub-pixels 102 are both trapezoid, a base of the red sub-pixels 101 and a base of the blue sub-pixels 102 are disposed to be opposite to each other.

The shape of each green sub-pixel 103 is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other; the bases of the red sub-pixels 101 and of the blue sub-pixels are parallel to the pair of parallel opposite sides of the green sub-pixel 103.

Figure 2C:
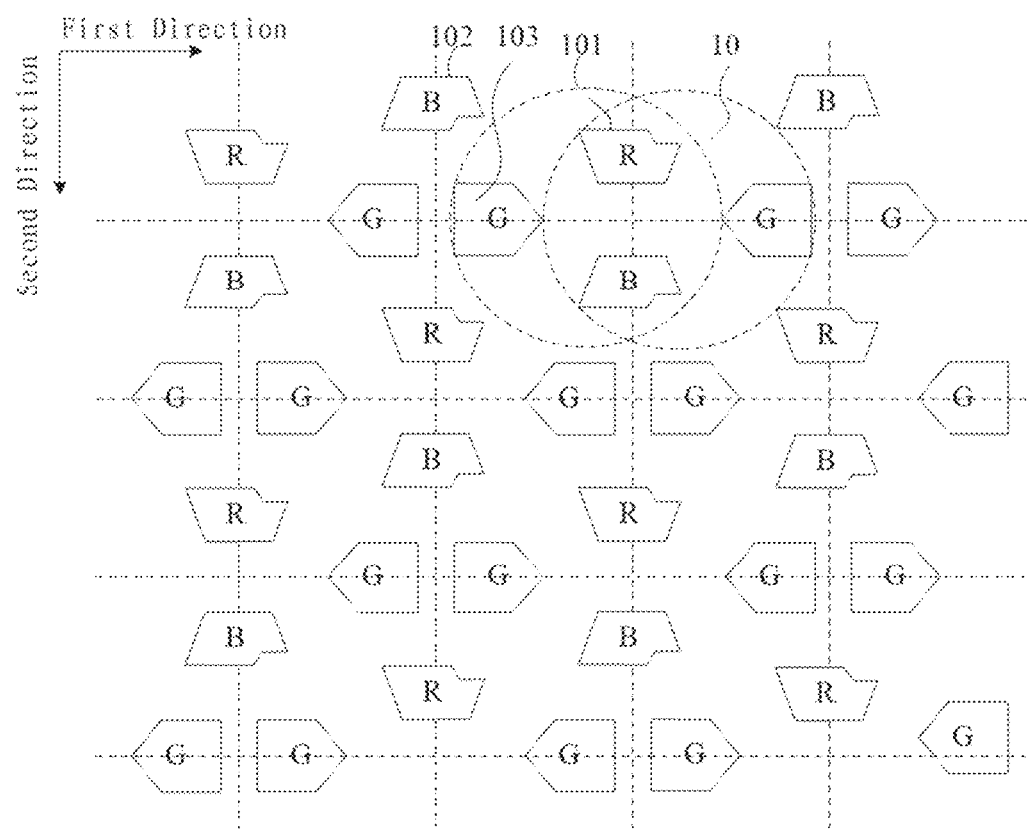
FIG. 2(c) is a diagram illustrating the actual arrangement of red, green and blue sub-pixels in the pixel arrangement structure according to an embodiment of the present disclosure.

It is to be noted that, the shape of the red sub-pixels 101 and the blue sub-pixels 102 ideally may be trapezoid, but in the actual FMM process, as the metallic etching may cause draft angles, so when using FMM vapor-deposit techniques for making read sub-pixels 101 and blue sub-pixels 102, the form of such formed red sub-pixels 101 and blue sub-pixels 102 may not be a standard trapezoid but in the shape as illustrated in FIG. 2(c). In an example illustrated in FIG. 2(c), the shape is a trapezoid with a corner being cut off.

In addition, although a shape of each sub-pixel in the drawings includes an angle formed by two standard line segments, in some embodiments, each sub-pixel may have a shape with rounded corners. That is to say, based on the above shapes of various pattern illustrated in figures, corners of each sub-pixel is rounded. For example, in the case where a light-emitting layer is vapor-deposited by a fine metal mask (FMM), a part of the light-emitting layer located at the corner may naturally form a shape with rounded corner.

In the embodiments of the present disclosure, as two green sub-pixels 103 are disposed adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus reducing the techniques complexity of the FMM techniques. As illustrated in FIG. 2(a) and FIG. 2(b), the green sub-pixels 103 as the luminance center of the virtual pixels, in the first direction, all of the green sub-pixels 103 are on the vertical dash lines, in the second direction, all of the green sub-pixels 103 are on either side of the vertical dash lines, and the green sub-pixels 103 are evenly distributed in the pixel array, thus guaranteeing that the horizontal and vertical lines of the center of the luminance to be smooth and continuous (as illustrated in dash lines in FIG. 2(a) and FIG. 2(b)).

Further, as illustrated in FIG. 2(a), the shorter base of the red sub-pixel 101 and the shorter base of the blue sub-pixel 102 are disposed to be adjacent to each other. In other words, the shorter base of the red sub-pixel 101 and the shorter base of the blue sub-pixel 102 are disposed to be opposed to each other.

In the embodiments of the present disclosure, a red sub-pixel 101 and a blue sub-pixel 102 are disposed between any two adjacent pairs of green sub-pixels 103, and since the shape of the red sub-pixel 101 and of the blue sub-pixel 102 is trapezoid, the shorter base of the red sub-pixel 101 and the shorter base of the blue sub-pixel 102 are disposed adjacent to each other, such that the distance between the green sub-pixels 103 and the red sub-pixels 101 as well as the blue sub-pixels 102 is relatively far, which is advantageous for the FMM design, and for reducing the FMM techniques complexity.

For example, in the second direction, the green sub-pixels 103 are disposed in pairs in each of which two sub-pixels are adjacently disposed, and one red sub-pixel 101 and one blue sub-pixel 102 are disposed between any two adjacent pairs of the green sub-pixels 103.

In other words, in the second direction all the green sub-pixels 103 are disposed in pairs, and in each pair two green sub-pixels 103 are disposed adjacent to each other.

Based on this, in an example, one red sub-pixel 101 and one blue sub-pixel 102 between any two adjacent pairs of green sub-pixels 103 are disposed to be opposed to each other in the first direction.

Here since in the second direction, the red sub-pixels 101 and the blue sub-pixels 102 are all disposed between two adjacent pairs of green sub-pixels 103, thus the requirement that the sub-pixel density is 1.5 times of the pixel density may be satisfied. The proportion of the numbers of the red sub-pixels 101, the green sub-pixels 103 and the blue sub-pixels 102 may be 1:2:1.

It is to be noted that in the second direction, the green sub-pixels 103 are disposed in pairs and within each pair two green sub-pixels 103 are disposed adjacent to each other; one red sub-pixel 101 and one blue sub-pixel may be disposed between any two adjacent pairs of green sub-pixels 103, which allows that in the first direction and in the second direction, the sub-pixel density is 1.5 times of pixel density and the virtual pixel array is evenly distributed. For example, the green sub-pixels which are in pairs and within each pair the two green sub-pixels being adjacent to each other forms a plurality of green sub-pixel pairs arranged in the second direction. For example, the two green sub-pixels in each green sub-pixel pair are arranged in the second direction.

In the embodiments of the present disclose, in the second direction all the green sub-pixels 103 are disposed in pairs and within each pair two green sub-pixels being adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side in the second direction, and slight adjustments of the position of the green sub-pixels 103 may permit even distribution of the virtual pixel array. Also, by keeping certain distance between two most adjacent green sub-pixels 103, it may reduce the complexity of the techniques while guaranteeing the horizontal and vertical lines of the centers of the bright spots to be smooth and continuous (as illustrated in dash lines in FIG. 3(a) and FIG. 3(b)).

Figure 3A:
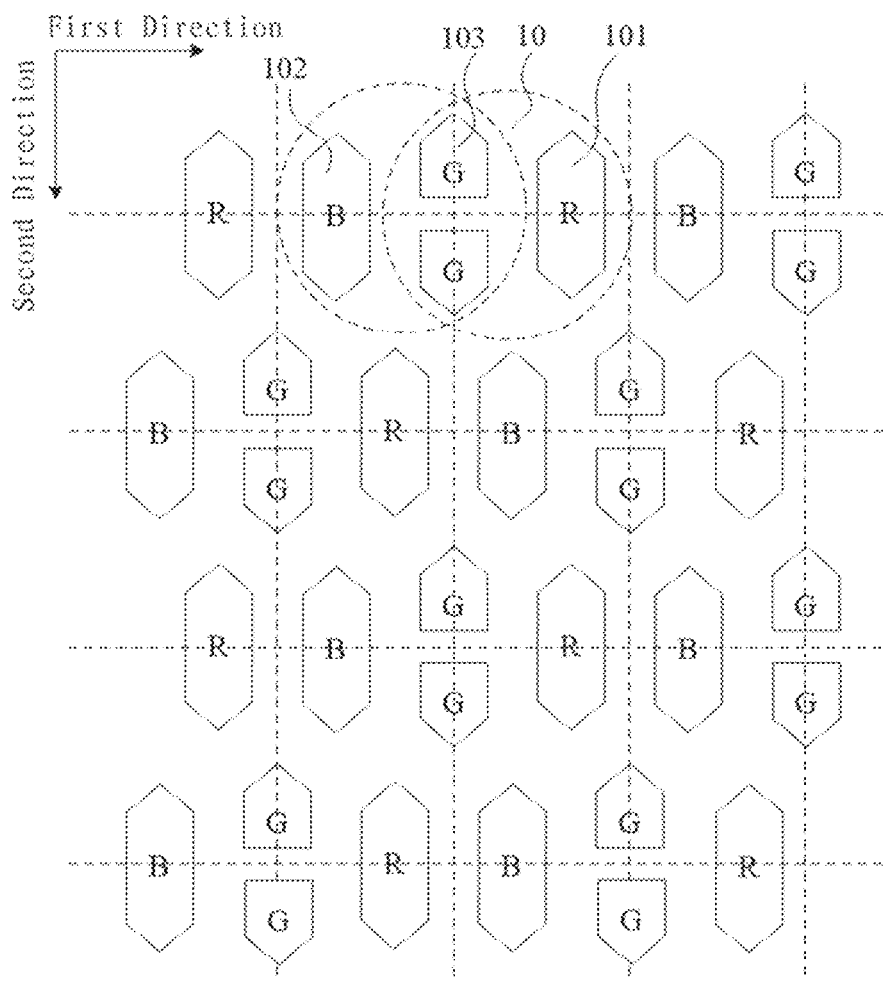
FIG. 3(a) is a third diagram illustrating the arrangement of red, green and blue sub-pixels in the pixel arrangement structure according to an embodiment of the present disclosure.
Figure 3B:
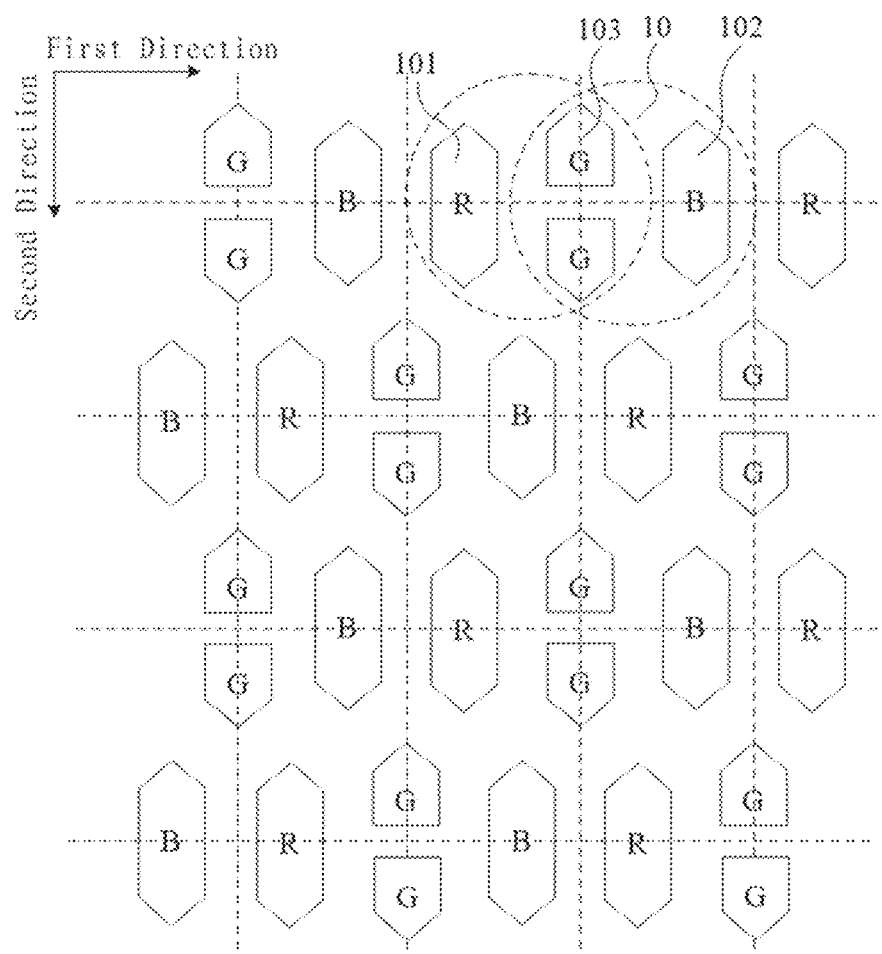
FIG. 3(b) is a fourth diagram illustrating the arrangement of red, green and blue sub-pixels in the pixel arrangement structure according to an embodiment of the present disclosure.

In some embodiments, as illustrated in FIG. 3(a) and FIG. 3(b), the shapes of the red sub-pixels [10]101 and the blue sub-pixels 102 are both hexagon, the three pairs of opposite sides of the hexagon having each pair of sides parallel to each other.

In addition, although a shape of each sub-pixel in the drawings includes an angle formed by two standard line segments, in some embodiments, each sub-pixel may have a shape with rounded corners. That is to say, based on the above shapes of various pattern illustrated in figures, corners of each sub-pixel is rounded. For example, in the case where a light-emitting layer is vapor-deposited by a FMM, a part of the light-emitting layer located at the corner may naturally form a shape with rounded corner.

The shape of each green sub-pixel is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other.

The pair of parallel opposite sides of the red sub-pixels 101 with longer length and the pair of parallel opposite sides of the blue sub-pixels 102 with longer length, are parallel to a pair of parallel opposite sides of the green sub-pixels 103.

Here it is to be noted that, positions of the red sub-pixels 101, the blue sub-pixels 102 and the green sub-pixels 103 in each repeating unit may be adjusted in an arbitrary manner as long as in the first direction and in the second direction of the pixel array, the sub-pixel density is 1.5 times of the pixel density, for example, as those illustrated in FIG. 3(a) or in FIG. 3(b).

It is noted that although some shapes of the sub-pixels in accordance with the embodiments of the present disclosure are described with reference to FIG. 2(a)-FIG. 3(b), the embodiments according to the present disclosure shall not be limited to those drawings and the sub-pixels according to the present disclosure may be in the any other shapes that may be suitable.

In the embodiments of the present disclosure, given that the pair of parallel opposite sides of the red sub-pixels 101 with longer length and the pair of parallel opposite sides of the blue sub-pixels 102 with longer length, are parallel to a pair of parallel opposite sides of the green sub-pixels 103, in one aspect, each FMM opening may be designed to be quasi-hexagon, thus favoring the FMM design; in another aspect, when FMM vapor-deposit techniques is adopted to vapor-deposit the sub-pixels, the net tensile force will be mainly applied on the longer side, thus avoiding damages to the FMM and favoring the success rate of net tension.

For example, as illustrated in FIG. 3(a) and FIG. 3(b), the red sub-pixel and the blue sub-pixel in each repeating unit are arranged in the first direction, and a pair of green sub-pixels are arranged in the second direction. In addition, the red sub-pixel, the blue sub-pixel and the green sub-pixel pair may be arranged in the first direction in sequence, or the green sub-pixel pair is arranged between one red sub-pixel and one blue sub-pixel.

As illustrated in FIG. 3(a) and FIG. 3(b), a plurality of repeating units arranged in the first direction form a plurality of repeating unit groups (repeating unit rows). For example, a dash line in the first direction refers to a central line of each of the plurality of repeating unit groups. The plurality of repeating unit groups are arranged in the second direction to form the pixel arrangement structure.

For example, in the above pixel arrangement structure, adjacent repeating unit groups are shifted in the first direction. That is, adjacent repeating unit groups have an offset in the first direction; therefore, sub-pixels of the same color in adjacent repeating unit groups are not aligned in the second direction. In some examples, an offset of adjacent repeating unit groups in the first direction is a half of a size of the repeating unit in the first direction. For example, the size of the repeating unit in the first direction is a pitch of the repeating units in the first direction.

As illustrated in FIG. 3(a) and FIG. 3(b), the repeating unit groups in odd-numbered rows have the same pixel arrangement manner, and the repeating unit groups in even-numbered rows have the same pixel arrangement manner. For example, except the edge portion of the pixel arrangement structure, a line passing through centers of the two green sub-pixels in each repeating unit is located between centers of adjacent red sub-pixel and blue sub-pixel in adjacent repeating unit groups. Moreover, edges of the two green sub-pixels are located at an inner side of the outermost edges of the above-mentioned adjacent red sub-pixel and blue sub-pixel, and the outermost edges are the edges away from each other along the first direction of the two sub-pixels. For example, if the two sub-pixels are arranged along the first direction from a left side to a right side, the outermost edges of the two sub-pixels are the left edge of the sub-pixel at the left side and the right edge of the sub-pixels at the right side. That is, in the first direction, an extending range of one green sub-pixel pairs in the first direction is not beyond an extending range of the above-mentioned adjacent red sub-pixel and blue sub-pixel in the first direction.

For example, for the above-mentioned pixel arrangement structure, a ratio of the sub-pixels of red, blue and green is 1:1:2. One red sub-pixel and one green sub-pixel constitute a pixel, and one blue sub-pixel and one green sub-pixel constitute a pixel. The specific combinations of sub-pixels in each pixel are not limited in the embodiments of the present disclosure. For example, one red sub-pixel and one green sub-pixel in a repeating unit constitute a pixel, and one blue sub-pixel and one green sub-pixel in the repeating unit constitute a pixel. Alternatively, for the green sub-pixel pairs in the same repeating unit, one of the green sub-pixels and one red sub-pixel in the repeating unit form a pixel, and the other of the green sub-pixels and one blue sub-pixel in an adjacent repeating unit form a pixel.

For example, as illustrated in FIG. 3(a) and FIG. 3(b), green sub-pixels are arranged in the second direction, a size of the red sub-pixel in the second direction is greater than that of the red sub-pixel in the first direction, similarly, a size of the blue sub-pixel in the second direction is greater than that of the blue sub-pixel in the first direction.

The embodiments of the present disclosure provides a display panel, pixels of the display panel are arranged according to the above-described pixel arrangement structure.

The embodiment of the present disclosure also provides a display device, which comprises the above-described display panel.

The display device in accordance with the embodiments of the present disclosure can be applied to any display device including three sub-pixels such as red, green and blue sub-pixels, for example, liquid crystal display (LCD) and organic light-emitting diode (OLED), etc.

In the study, the inventor(s) of the present application notices that: in order to manufacture a high-resolution display device, it is necessary to reduce a pixel size and a pixel pitch; however, reduction in the pixel size and the pixel pitch is also increasingly demanding for precision of manufacturing process, which may result in increased difficulties and costs in a manufacturing process of the display device. For example, upon a high-resolution active matrix organic light emitting diode (AMOLED) display device being manufactured, due to a limitation in process precision of a fine metal mask (FMM) technology, it is difficult and expensive to manufacture the active matrix organic light emitting diode (AMOLED) display device having high resolution (for example, Pixels Per Inch (PPI) greater than 300).

Figure 4:
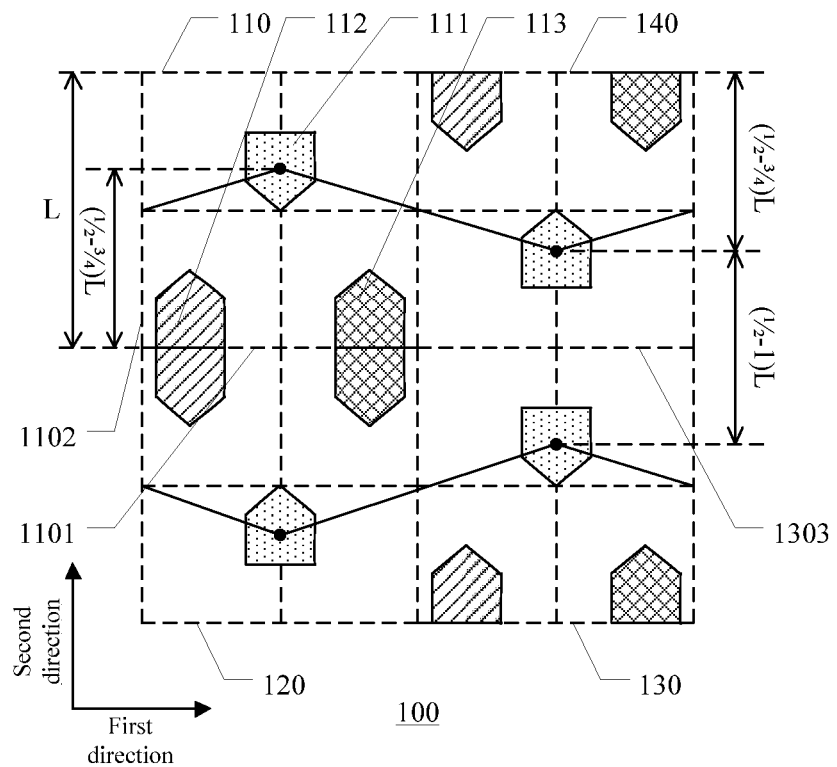
FIG. 4 is a schematic diagram of a pixel arrangement structure provided by an embodiment of the present disclosure.

At least one embodiment of the present disclosure provides a pixel arrangement structure. FIG. 4 is a schematic diagram of a pixel arrangement structure provided by an embodiment of the present disclosure. The pixel arrangement structure comprises a plurality of first color sub-pixel blocks 111, a plurality of second color sub-pixel blocks 112 and a plurality of third color sub-pixel blocks 113 distributed in a plurality of minimum repeating regions 100. FIG. 4 shows one minimum repeating region 100; as illustrated by FIG. 4, each of the plurality of minimum repeating regions 100 includes a first virtual rectangle 110; and the first virtual rectangle 110 includes one first color sub-pixel block 111, one second color sub-pixel block 112 and one third color sub-pixel block 113. The first virtual rectangle 110 includes a first edge 1101 extending in a first direction and a second edge 1102 extending in a second direction; the second color sub-pixel block 112 and the third color sub-pixel block 113 are distributed on two sides of a perpendicular bisector of the first edge 1101; a distance between the second color sub-pixel block 112 and the first edge 1101 and a distance between the third color sub-pixel block 113 and the first edge 1101 are both smaller than a distance between the first color sub-pixel block 111 and the first edge 1101; and a center of the first color sub-pixel block 111 is located on the perpendicular bisector of the first edge 1101 and a distance between the center of the first color sub-pixel block 111 and the first edge 1101 is approximately ½ to ¾ of a length of the second edge 1102. For example, as illustrated by FIG. 4, the length of the second edge 1102 is L, and the distance between the center of the first color sub-pixel block 111 and the first edge 1101 is (½ to ¾) L. It should be noted that, the above-described first virtual rectangle is intended to better describe a position of the first color sub-pixel block, and is not an actual structure. In addition, a range of a virtual rectangle of the above-described first virtual rectangle may be larger than a light-emitting region of the first color sub-pixel block, the second color sub-pixel block and the third color sub-pixel block in the first virtual rectangle. The above-described "center" refers to a geometric center of a shape of a sub-pixel block (for example, the first color sub-pixel block, the second color sub-pixel block or the third color sub-pixel block); and the above-described "a distance between the second color sub-pixel block and the first edge and a distance between the third color sub-pixel block and the first edge" refer to a distance between the center of the second color sub-pixel block and the first edge and a distance between the center of the third color sub-pixel block and the first edge.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge is ½ to ¾ of the length of the second edge, a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve uniformity of distribution of first color sub-pixel blocks, so as to improve visual resolution and further improve display quality.

It should be noted that, upon designing a pixel arrangement structure, the sub-pixel is generally designed in a regular shape, such as a hexagon, a pentagon, a trapezoid or other shapes. The center of the sub-pixel may be the geometric center of the above regular shape upon designing. However, in an actual manufacturing process, the shape of the formed sub-pixels generally deviates from the regular shape of the above design. For example, corners of the abovementioned regular shape may be rounded; therefore, the shape of the sub-pixel can be a figure with rounded angle. Furthermore, the shape of the actually fabricated sub-pixel can also have other variations from the shape of the design. For example, the shape of a sub-pixel designed as a hexagon may become approximately elliptical in actual fabrication. Therefore, the center of the sub-pixel may also not be the strict geometric center of the irregular shape of the formed sub-pixel. In embodiments of the present disclosure, the center of the sub-pixel may have a certain offset from the geometric center of the shape of the sub-pixel. The center of a sub-pixel refers to any point in a region surrounded by specific points on radiation segments each of which is from a geometric center of the sub-pixel to a point on the edge of the sub-pixel, each of the specific points is located on a corresponding radiation segment at location ⅓ of length of the radiant section from the geometric center. The definition of the center of the sub-pixel is applicable to the center of the sub-pixel having the regular shape, and is also applicable to the center of the sub-pixel having the irregular shape.

For example, in some examples, the above-described minimum repeating region can be translated and arranged repeatedly to form a complete pixel arrangement structure. It should be noted that any sub-unit that can be translated and arranged repeatedly is not included in the minimum repeating region.

For example, in some examples, the center of the first color sub-pixel block 111 is located on the perpendicular bisector of the first edge 1101 and has the distance between the center of the first color sub-pixel block 111 and the first edge 1101 is ½ to ¾ of the length of the second edge 1102.

It should be noted that, upon the pixel arrangement structure being designed, the sub-pixel block (for example, the first color sub-pixel block, the second color sub-pixel block or the third color sub-pixel block) is usually designed to have a regular shape of, for example, a hexagon, a pentagon, a trapezoid, and the like. In design, the center of the sub-pixel block may be a geometric center of the above-described regular shape. However, in an actual manufacturing process, the shape of the formed sub-pixel block usually has certain deviation from the regular shape as designed above. For example, respective corners of the above-described regular shape may become rounded, so the shape of the sub-pixel block (for example, the first color sub-pixel block, the second color sub-pixel block or the third color sub-pixel block) may be a rounded shape. In addition, the shape of the actually manufactured sub-pixel block may further have other variations from the designed shape. For example, the shape of the sub-pixel block designed as a hexagon may become an approximate ellipse in actual fabrication. Therefore, the center of the sub-pixel block may not be the strict geometric center of the irregular shape of the sub-pixel block manufactured. In the embodiment of the present disclosure, the center of the sub-pixel block may have a certain offset from the geometric center of the shape of the sub-pixel block. The center of the sub-pixel block refers to any point within a region enclosed by specific points on radiation line segments starting from the geometric center of the sub-pixel block to respective points of an edge of the sub-pixel block, and the specific point on the radiation line segment is located at a distance of ⅓ the length of the radiation line segment from the geometric center. A definition of the center of the sub-pixel block is applicable to the center of the shape of the regular-shaped sub-pixel block, and is also applicable to the center of the irregular-shaped sub-pixel block.

In addition, as described above, due to various fabrication errors, the shape of the actually manufactured sub-pixel block may deviate from the shape of the designed sub-pixel block. Therefore, in the present disclosure, a certain error is allowed in a position of the center of the sub-pixel block as well as a relationship between the center of the sub-pixel block and a position of any other object. For example, with respect to a line connecting centers of sub-pixel blocks or a line passing through the center of the sub-pixel block, if the line satisfies other corresponding definitions (for example, an extension direction), the line only has to pass through the region enclosed by the specific points of the radiation line segments as described above. For another example, if the center of the sub-pixel block is located on a certain line, it refers to that the line only has to pass through the region enclosed by the specific points of the radiation line segments as described above.

For example, in some examples, the first color sub-pixel block 111, the second color sub-pixel block 112 and the third color sub-pixel block 113 may separately serve as one sub-pixel for display; and the first color sub-pixel block 111, the second color sub-pixel block 112 and the third color sub-pixel block 113 in the first virtual rectangle 110 may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel into one sub-pixel for display.

For example, in some examples, the first color sub-pixel block is a sensitive color sub-pixel. Because sensitivity of human eyes to colors is varied, upon adjacent sensitive color sub-pixels being closer to each other, it is likely that the adjacent two sensitive color sub-pixels are difficult to distinguish and are visually combined into one by the human eyes due to a closer distance between the adjacent sensitive color sub-pixels. Thus, the pixel arrangement structure can improve distribution uniformity of sensitive color sub-pixels, so as to improve visual resolution and further improve display quality. It should be noted that, upon a red, green and blue (RGB) mode being used in the pixel arrangement structure, the above-described sensitive color is green.

For example, in some examples, the first color sub-pixel block is a green sub-pixel, the second color sub-pixel block is a red sub-pixel, and the third color sub-pixel block is a blue sub-pixel; or, the first color sub-pixel block is a green sub-pixel, the second color sub-pixel block is a blue sub-pixel, and the third color sub-pixel block is a red sub-pixel. Of course, the embodiment of the present disclosure includes, but is not limited thereto.

For example, in some examples, a distance between an edge of the first color sub-pixel block 111 that is close to the first edge 1101 and the first edge 1101 is ⅓ to 5/12 of the length of the second edge 1102. Therefore, a distance between two closest edges of adjacent two first color sub-pixel blocks is larger than ⅙ of the length of the second edge.

For example, in some examples, a distance between the center of the first color sub-pixel block and the first edge is 9/16 to 11/16 of the length of the second edge. Thus, distribution uniformity of first color sub-pixel blocks can be further improved, so as to further improve visual resolution and further improve display quality.

For example, in some examples, the distance between the center of the first color sub-pixel block and the first edge is ⅝ of the length of the second edge. Thus, distribution uniformity of first color sub-pixel blocks can be further improved, so as to further improve visual resolution and further improve display quality.

For example, in some examples, the above-described virtual rectangle may be a square, that is to say, the first edge and the second edge are equal in length.

For example, in some examples, as illustrated by FIG. 4, each of the plurality of minimum repeating regions 100 further includes a second virtual rectangle 120, a third virtual rectangle 130 and a fourth virtual rectangle 140. The first virtual rectangle 110, the second virtual rectangle 120, the third virtual rectangle 130 and the fourth virtual rectangle 140 form a 2*2 matrix in an edge-sharing manner to constitute one of the plurality of minimum repeating regions 100; the second virtual rectangle 120 shares the first edge 1101 with the first virtual rectangle, and is mirror-symmetrical to the first virtual rectangle with respect to the first edge 1101; the first virtual rectangle 110 coincides with the third virtual rectangle 130 by shifting a distance of a length of a diagonal line of the first virtual rectangle 110 along the diagonal line; the third virtual rectangle 130 includes a third edge 1303 extending in the first direction, and the fourth virtual rectangle 140 shares the third edge 1303 with the third virtual rectangle 130, and is mirror-symmetrical to the third virtual rectangle 130 with respect to the third edge 1303. It should be noted that, the first virtual rectangle, the second virtual rectangle, the third virtual rectangle and the fourth virtual rectangle are closely arranged to form the minimum repeating region having a rectangular shape. It should be noted that, the above-described word "coincide" refers to that three sub-pixel blocks in the third virtual rectangle have same shapes and positions as the three sub-pixel blocks in the first virtual rectangle translated along the diagonal line of the first virtual rectangle for the length of the diagonal line. Here, the word "coincide" only refers to that the pixel blocks coincide with each other, while other structures may be different or the same. In addition, the above-described word "coincide" refers to that approximate positions, shapes and sizes only have to be similar; and in some cases, the shapes may be slightly different for the sake of wiring or opening, for example, opening at different positions. Furthermore, corresponding sub-pixels or sub-pixel blocks or other components in virtual rectangles only need to have at least 70% of an area overlapped so as to be deemed to "coincide" as described in the present disclosure; and corresponding sub-pixels or sub-pixel blocks in virtual rectangles only need to have at least 70% of an area overlapped after a mirroring operation so as to be deemed to "be mirror-symmetrical" as described in the present disclosure.

In the pixel arrangement structure provided by this embodiment, the second virtual rectangle is mirror-symmetrical to the first virtual rectangle, a structure of the third virtual rectangle is the same as a structure of the first virtual rectangle translated along the diagonal line of the first virtual rectangle, the fourth virtual rectangle is mirror-symmetrical to the third virtual rectangle; a distance between a center of a first color sub-pixel block in the third virtual rectangle and the third edge is ½ to ¾ of the length of the second edge, and a distance between a center of a first color sub-pixel block in the fourth virtual rectangle and the third edge is ½ to ¾ of the length of the second edge, so a distance between the center of the first color sub-pixel block in the third virtual rectangle and the center of the first color sub-pixel block in the fourth virtual rectangle is greater than ½ of the length of the second edge, which, thus, can avoid a case where adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

In addition, as illustrated by FIG. 4, the distance between the center of the first color sub-pixel block in the first virtual rectangle and the first edge is ½ to ¾ of the length of the second edge, the distance between the center of the first color sub-pixel block in the fourth virtual rectangle and the third edge is ½ to ¾ of the length of the second edge, and a slope between a connecting line between the first color sub-pixel block in the first virtual rectangle and the first color sub-pixel block in the fourth virtual rectangle is relatively low; so upon pixel units belonging to a same row (for example, the first virtual rectangle and the fourth virtual rectangle) collectively displaying a straight line, because the slope of the connection line between the first color sub-pixel block in the first virtual rectangle and the first color sub-pixel block in the fourth virtual rectangle is relatively low, a fluctuation range of the first color sub-pixel block in the first virtual rectangle and the first color sub-pixel block in the fourth virtual rectangle is relatively small, which, thus, can avoid a case where two straight lines displayed by adjacent rows are difficult to distinguish and are visually combined into one by human eyes due to mutual occlusion of the two straight lines resulted from a relatively large fluctuation range. Thus, the pixel arrangement structure can improve visual resolution.

In addition, in the pixel arrangement structure, the second virtual rectangle is mirror-symmetrical to the first virtual rectangle, the structure of the third virtual rectangle is the same as the structure of the first virtual rectangle translated along the diagonal line of the first virtual rectangle, and the fourth virtual rectangle is mirror-symmetrical to the third virtual rectangle, which can improve distribution uniformity of sub-pixels in the pixel arrangement structure, and can also avoid formation of a color line. In addition, within the minimum repeating region 100, there is no color mixing problem in same color sub-pixels, and a second color sub-pixel block 112 in the first virtual rectangle 110 is closer to a second color sub-pixel block 112 in the second virtual rectangle 120, so upon the pixel arrangement structure being applied to an organic light-emitting display device, a light-emitting layer of the second color sub-pixel block 112 in the first virtual rectangle 110 and a light-emitting layer of the second color sub-pixel block 112 in the second virtual rectangle 120 may be formed through the same opening on a mask plate; similarly, upon the pixel arrangement structure being applied to an organic light-emitting display device, because a third color sub-pixel block 113 in the first virtual rectangle 110 is closer to a third color sub-pixel block 113 in the second virtual rectangle 120, a light-emitting layer of the third color sub-pixel block 113 in the first virtual rectangle 110 and a light-emitting layer of the third color sub-pixel block 113 in the second virtual rectangle 120 may also be formed through the same opening on a mask.

For example, in some examples, the first color sub-pixel block 111, the second color sub-pixel block 112 and the third color sub-pixel block 113 in the second virtual rectangle 120 may constitute one pixel unit for color display; the first color sub-pixel block 111, a second color sub-pixel block 112 and a third color sub-pixel block 113 in the third virtual rectangle 130 may constitute one pixel unit for color display; and the first color sub-pixel block 111, a second color sub-pixel block 112 and a third color sub-pixel block 113 in the fourth virtual rectangle 140 may constitute one pixel unit for color display.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge which is ½ to ¾ of the length of the second edge; a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

For example, in some examples, as illustrated by FIG. 4, within the first virtual rectangle 110, the second color sub-pixel block 112 and the third color sub-pixel block 113 are respectively close to two ends of the first edge 1101. It should be noted that, according to the above-described relationship of the second virtual rectangle, the third virtual rectangle and the fourth virtual rectangle with the first virtual rectangle, a positional relationship between the second color sub-pixel block and the third color sub-pixel block in the second virtual rectangle, the third virtual rectangle and the fourth virtual rectangle also change accordingly. For example, as illustrated by FIG. 4, in the fourth virtual rectangle 140, a distance between the center of the first color sub-pixel block 111 and an upper edge of the fourth virtual rectangle 140 (equivalent to the first edge 1101 in the first virtual rectangle 110) is ½ to ¾ of the length of the second edge.

For example, in some examples, as illustrated by FIG. 4, within the first virtual rectangle 110, edges of the second color sub-pixel block 112 and the third color sub-pixel block 113 that are away from a center of the first virtual rectangle 110 are located on the first edge, so that space within the first virtual rectangle can be utilized to the greatest extent. It should be noted that, according to the above-described relationship of the second virtual rectangle, the third virtual rectangle and the fourth virtual rectangle with the first virtual rectangle, the positional relationship between the second color sub-pixel block and the third color sub-pixel block in the second virtual rectangle, the third virtual rectangle and the fourth virtual rectangle also change accordingly.

For example, in some examples, as illustrated by FIG. 4, shortest distances among the first color sub-pixel block 111, the second color sub-pixel block 112 and the third color sub-pixel block 113 are equal to one another. That is to say, a shortest distance between the first color sub-pixel block 111 and the second color sub-pixel block 112, a shortest distance between the first color sub-pixel block 111 and the third color sub-pixel block 113, and a shortest distance between the second color sub-pixel block 112 and the third color sub-pixel block 113 are equal to one another, so that process precision can be utilized to the greatest extent.

For example, in some examples, as illustrated by FIG. 4, the shape of the second color sub-pixel block 112 is the same as the shape of the third color sub-pixel block 113, and the shape of the second color sub-pixel block 112 and the shape of the third color sub-pixel block 113 are symmetrical to each other with respect to a diagonal line of the shape of the first color sub-pixel block 111, which is located between right angles formed by a first connection line and a second connection line. Thus, symmetry and uniformity of the pixel arrangement structure may be further improved, so as to further improve display quality.

For example, in some examples, as illustrated by FIG. 4, the shape of the first color sub-pixel block 111 is a right-base-angle symmetrical pentagon; the right-base-angle symmetrical pentagon is symmetrical with respect to the perpendicular bisector of the first edge 1101; and a base of the right-base-angle symmetrical pentagon is parallel to the first edge 1101 or is located on the first edge 1101, and is further away from the first edge 1101 than a vertex of the right-base-angle symmetrical pentagon in a direction perpendicular to the first edge 1101. As illustrated by FIG. 4, two oblique edges of the first color sub-pixel block 111 may be provided respectively opposite to the second color sub-pixel block 112 and the third color sub-pixel block 113, so that in a case where process precision is constant, that is to say, in a case where distances from the first color sub-pixel block 111 respectively to the second color sub-pixel block 112 and the third color sub-pixel block 113 are constant, an area of the first color sub-pixel block 111 is increased. Thus, the pixel arrangement structure can improve a utilization ratio of space within the first virtual rectangle. It should be noted that, the above-described expression "be provided opposite" refers to that the two oblique edges of the first color sub-pixel block 111 respectively face the second color sub-pixel block 112 and the third color sub-pixel block 113.

For example, in some examples, as illustrated by FIG. 4, the shapes of the second color sub-pixel block 112 and the third color sub-pixel block 113 are both right-base-angle symmetrical pentagons; the right-base-angle symmetrical pentagons are symmetrical to each other with respect to the perpendicular bisector of the first edge; and bases of the right-base-angle symmetrical pentagons are parallel to the first edge 1101 or are located on the first edge 1101, and are closer to the first edge 1101 than the vertexes of the right-base-angle symmetrical pentagons in the direction perpendicular to the first edge 1101. As illustrated by FIG. 4, oblique edges of the second color sub-pixel block 112 and the third color sub-pixel block 113 that are close to the first color sub-pixel block 111 may be respectively opposite to the first color sub-pixel block 111, so that in a case where process precision is constant, that is to say, in the case where the distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve the utilization ratio of the space within the first virtual rectangle.

For example, a distance between adjacent edges of two first color sub-pixel blocks is greater than or equal to 12 microns, or greater than or equal to 14 microns. As illustrated by FIG. 4, two first color sub-pixel blocks in each minimum repeating region, for example, refer to one first color sub-pixel block in a fourth virtual rectangle 140 and one first color sub-pixel block in a third virtual rectangle 130. Adjacent edges of the two first color sub-pixel blocks are just an edge of a lower side of the upper first color sub-pixel block and an edge of an upper side of the lower first color sub-pixel block. The above-described distance between the two first color sub-pixel blocks can be set to different numerical values according to different resolution conditions. For example, the distance between the adjacent edges of the two first color sub-pixel blocks is greater than or equal to 12 microns in a case of quarter full high definition resolution, and is greater than or equal to 14 microns in a case of full high definition resolution.

It should be noted that, although the shapes of the sub-pixel blocks shown in the drawings include a corner strictly formed by two straight lines, in some embodiments, the shapes of the sub-pixel blocks may be rounded shapes, that is, corners of the shapes of the sub-pixel blocks are rounded. For example, the light emitting layer can be formed by an evaporation process through a mask, and therefore, a corner portion thereof can be a rounded shape.

Figure 5:
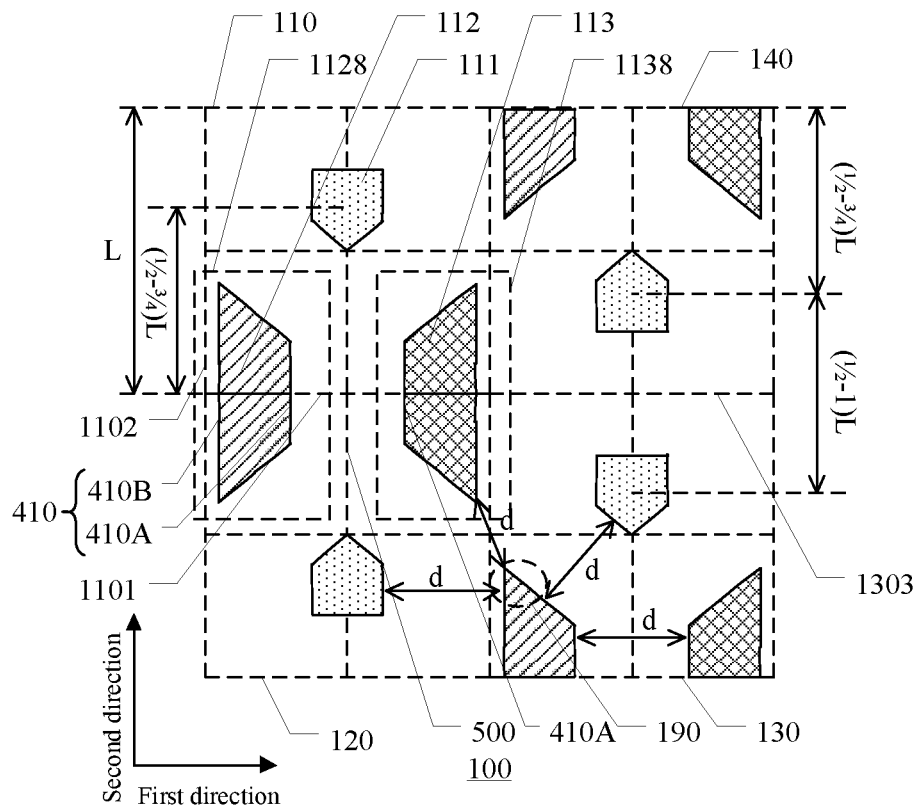
FIG. 5 is a schematic diagram of another pixel arrangement structure provided by an embodiment of the present disclosure.

FIG. 5 is a schematic diagram of another pixel arrangement structure provided by an embodiment of the present disclosure. As illustrated by FIG. 5, shapes of a second color sub-pixel block 112 and a third color sub-pixel block 113 are both right-angled trapezoids; bases of the right-angled trapezoids are perpendicular to a first edge 1101; and a distance between a right-angle edge of the right-angled trapezoid and the first edge 1101 is smaller than a distance between an oblique edge of the right-angled trapezoid and the first edge 1101. As illustrated by FIG. 5, the oblique edges of the second color sub-pixel block 112 and the third color sub-pixel block 113 may be respectively opposite to a first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve a utilization ratio of space within a first virtual rectangle. Moreover, because the shapes of the second color sub-pixel block 112 and the third color sub-pixel block 113 are both right-angled trapezoids: as compared with a case where the shapes of the second color sub-pixel block 112 and the third color sub-pixel block 113 are both right-base-angle symmetrical pentagons, acute angle portions 190 of the second color sub-pixel block 112 and the third color sub-pixel block 113 may further increase the areas of the second color sub-pixel block 112 and the third color sub-pixel block 113, so as to further improve the utilization ratio of the space within the first virtual rectangle.

For example, in some examples, as illustrated by FIG. 5, a shape of the first color sub-pixel block 111 is a right-base-angle symmetrical pentagon; the right-base-angle symmetrical pentagon is symmetrical with respect to a perpendicular bisector of the first edge; a base of the right-base-angle symmetrical pentagon is parallel to the first edge 1101, and is further away from the first edge than a vertex of the right-base-angle symmetrical pentagon in a direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the oblique edge of the second color sub-pixel block 112 are parallel to each other and have a spacing of a fifth distance; and the fourth oblique edge 194 of the first color sub-pixel block 111 and the oblique edge of the third color sub-pixel block are parallel to each other and have a spacing of a sixth distance.

For example, in some examples, as illustrated by FIG. 5, within a first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; a third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; a spacing between an acute angle portion 190 of the third color sub-pixel block 113 in the first virtual rectangle 110 and an acute angle portion 190 of the second color sub-pixel block 112 in the fourth virtual rectangle 140 is a seventh distance; and a spacing between an acute angle portion 190 of the third color sub-pixel block 113 in the second virtual rectangle 120 and an acute angle portion 190 of the second color sub-pixel block 112 in the third virtual rectangle 130 is an eighth distance.

For example, in some examples, as illustrated by FIG. 5, the fifth distance, the sixth distance, the seventh distance and the eighth distance are all equal to one another.

For example, as illustrated in FIG. 5, a distance between a third color sub-pixel block and a first color sub-pixel block that are adjacent to each other is equal to a distance between a third color sub-pixel block and a second color sub-pixel block that are adjacent to each other, both being distance d. In some examples, a distance between a first color sub-pixel block and a second color sub-pixel block that are adjacent to each other is also equal to the above-described distance d.

For example, in some examples, as illustrated by FIG. 5, the second color sub-pixel block and the third color sub-pixel block may also have an asymmetrical shape which, for example, is asymmetrical with respect to a straight line passing through its center in a second direction.

Figure 6:
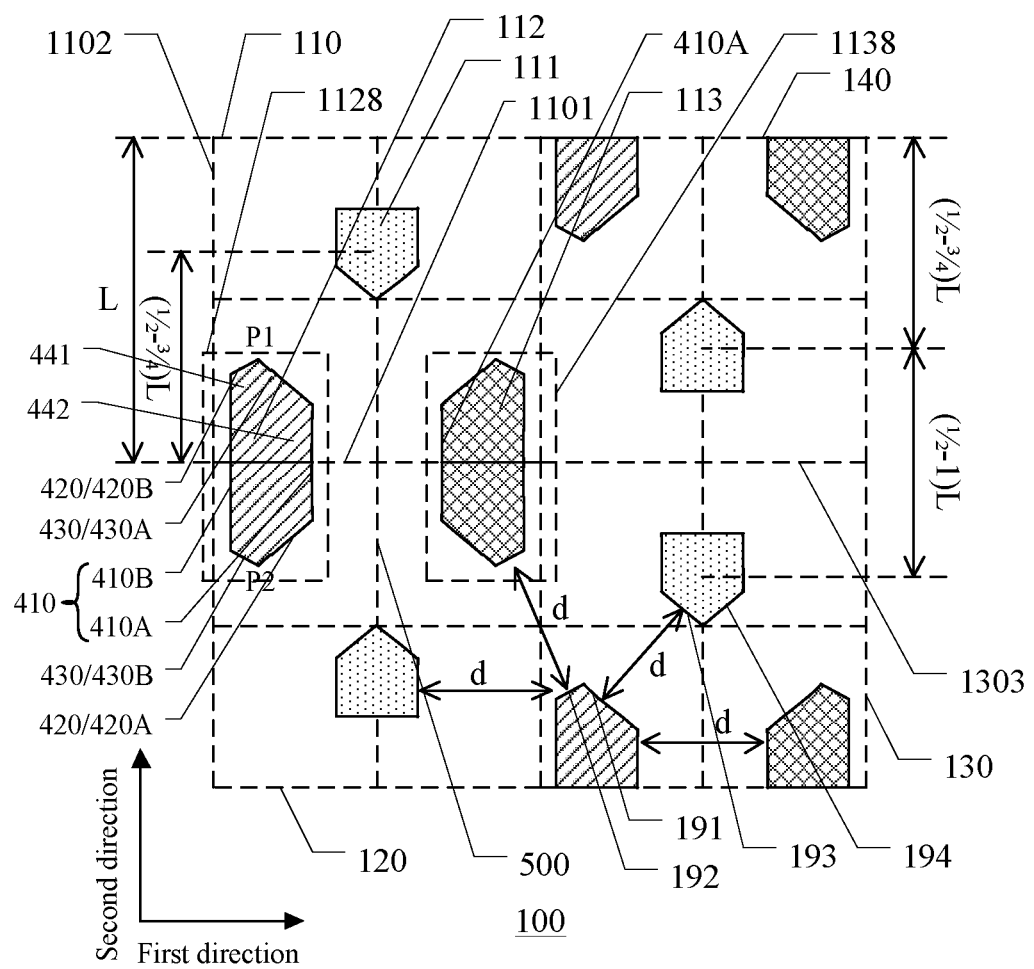
FIG. 6 is a schematic diagram of another pixel arrangement structure provided by an embodiment of the present disclosure.

FIG. 6 is a schematic diagram of another pixel arrangement structure provided by an embodiment of the present disclosure. As illustrated by FIG. 6, shapes of a second color sub-pixel block 112 and a third color sub-pixel block 113 are both right-base-angle pentagons; bases of the right-base-angle pentagons are parallel to a first edge 1101 or are located on the first edge 1101, and are closer to the first edge 1101 than vertexes of the right-base-angle pentagons in a direction perpendicular to the first edge 1101; the right-base-angle pentagon includes a first oblique edge 191 and a second oblique edge 192 passing through the vertex; the first oblique edge 191 is opposite to a first color sub-pixel block 111; and a length of the first oblique edge 191 is larger than a length of the second oblique edge 192. For example, a first oblique edge 191 of the second color sub-pixel block 112 is opposite to the first color sub-pixel block 111, and a first oblique edge 191 of the third color sub-pixel block 113 is opposite to the first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased, so as to improve a utilization ratio of space within a first virtual rectangle. Moreover, because the shapes of the second color sub-pixel block 112 and the third color sub-pixel block 113 are both right-base-angle pentagons: as compared with a case where the shapes of the second color sub-pixel block 112 and the third color sub-pixel block 113 are both right-base-angle symmetrical pentagons, regions where the second oblique edges 192 of the second color sub-pixel block 112 and the third color sub-pixel block 113 are located may further increase the areas of the second color sub-pixel block 112 and the third color sub-pixel block 113, so as to further improve the utilization ratio of the space within the first virtual rectangle; and as compared with a case where the shapes of the second color sub-pixel block 112 and the third color sub-pixel block 113 are both right-angled trapezoids, the second oblique edges 192 of the second color sub-pixel block 112 and the third color sub-pixel block 113 can have a fabrication difficulty reduced, and in case where a technological level is relatively low, the shapes of the second color sub-pixel block and the third color sub-pixel block may be right-base-angle pentagons.

For example, a ratio of a length of an orthographic projection of the first oblique edge 191 in the first direction and a length of an orthographic projection of the second oblique edge 192 in the first direction is in a range of 2-6. Thus, a brightness center of the third color sub-pixel block is closer to the first color sub-pixel block, so as to reduce the risk of color separation.

For example, in some examples, as illustrated by FIG. 6, a shape of the first color sub-pixel block 111 is a right-base-angle symmetrical pentagon; the right-base-angle symmetrical pentagon is symmetrical with respect to a line parallel to the second direction and passing through the first edge; a base of the right-base-angle symmetrical pentagon is parallel to the first edge or is located on the first edge, and is further away from the first edge than the vertex of the right-base-angle symmetrical pentagon in the direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the first oblique edge 191 of the second color sub-pixel block 112 are parallel to each other and have a spacing of a first distance; and the fourth oblique edge 194 of the first color sub-pixel block 111 and the first oblique edge 191 of the third color sub-pixel block are parallel to each other and have a spacing of a second distance. It should be noted that, the above-described case of "being parallel" includes a case of being substantially parallel; and the above-described distance refers to a minimum distance, or a distance between two intersection points formed as a line connecting centers of two sub-pixels respectively intersects with two closest edges of the two sub-pixels.

For example, in some examples, as illustrated by FIG. 6, within the first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; the third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; the second oblique edge 192 of the third color sub-pixel block 113 in the first virtual rectangle 110 and a second oblique edge 192 of the second color sub-pixel block 112 in the fourth virtual rectangle 140 are parallel to each other and have a spacing of a third distance; and a second oblique edge 192 of the third color sub-pixel block 113 in the second virtual rectangle 120 and a second oblique edge 192 of the second color sub-pixel block 112 in the third virtual rectangle 130 are parallel to each other and have a spacing of a fourth distance.

For example, in some examples, the first distance, the second distance, the third distance and the fourth distance as described above are all equal to one another, so that a utilization ratio of process precision can be improved.

Figure 7A:
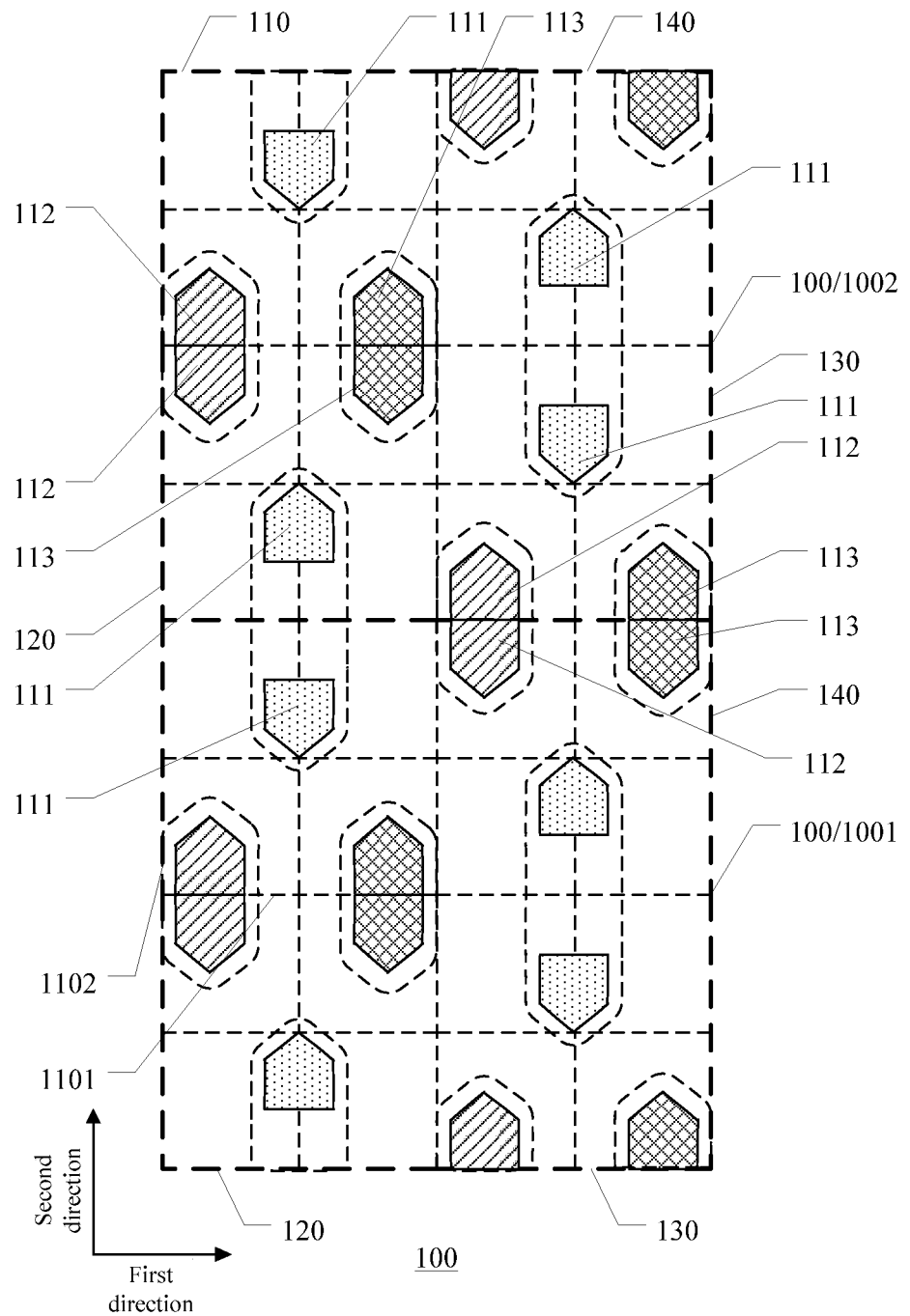
FIG. 7A is a schematic diagram of another pixel arrangement structure provided by an embodiment of the present disclosure.

FIG. 7A is a schematic diagram of another pixel arrangement structure provided by an embodiment of the present disclosure. FIG. 7A shows two minimum repeating regions 100; as illustrated by FIG. 7A, within the same minimum repeating region 100, a second color sub-pixel block 112 of a first virtual rectangle 110 and a second color sub-pixel block 112 of a second virtual rectangle 120 are combined into a same sub-pixel, i.e., a second unitary sub-pixel block 112S; within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a second color sub-pixel block 112 of a fourth virtual rectangle 140 of the first minimum repeating region 1001 and a second color sub-pixel block 112 of a third virtual rectangle 130 of the second minimum repeating region 1002 are combined into a same sub-pixel, i.e., i.e., a second unitary sub-pixel block 112S. Thus, combination of second color sub-pixel blocks into a same sub-pixel can reduce difficulty in manufacturing process of the second color sub-pixel blocks. In addition, upon the pixel arrangement structure being used in a display panel, it may be driven by using a Sub-pixel Rendering (SPR) algorithm to implement virtual display.

In some examples, in each of the second unitary sub-pixel block, a distance between centers of the two second color sub-pixel blocks is 0.1-0.5 times of a length of the first edge, so as to reduce the risk of color separation.

In some examples, in each of the second unitary sub-pixel block, a distance between centers of the two second color sub-pixel blocks is 0.1-0.35 times of a length of the first edge, so as to reduce the risk of color separation.

For example, in each of the second unitary sub-pixel block, the distance between centers of the two second color sub-pixel blocks is 0.2-0.3 times (for example, 0.27 times) of the length of the first edge, so as to further reduce the risk of color separation.

For example, a length a length-width ratio of the second unitary sub-pixel block is 1-8, so as to further reduce the risk of color separation. It should be noted that, the length-width ratio is a ratio of a length of a shape to a width of the shape. Besides, a length of the shape can be a size of the shape in the second direction, and a width of the shape can be a size of the shape in the first direction. Or, a length of the shape can be a largest size of the shape, and a width of the shape can be a smallest size of the shape.

For example, a length-width ratio of the second unitary sub-pixel block is 2-3 (for example, 2.6), so as to further reduce the risk of color separation.

It should be noted that, the second color sub-pixel block of the first virtual rectangle and the second color sub-pixel block of the second virtual rectangle within the same minimum repeating region that are combined into a same sub-pixel, or the second color sub-pixel block of the fourth virtual rectangle of the first minimum repeating region and the second color sub-pixel block of the third virtual rectangle of the second minimum repeating region that are combined into a same sub-pixel as described above are driven to emit light as a same sub-pixel. That is to say, the above-described second color sub-pixel blocks located in different virtual rectangles that are combined into a same sub-pixel serve only as a portion of one sub-pixel, and at this time, a center of the integrated sub-pixel is located on a first edge or on a shared edge of the adjacent two minimum repeating regions in the second direction.

For example, upon the second color sub-pixel block having a shape of right-base-angle symmetrical pentagon, the second unitary sub-pixel block has a shape of hexagon.

For example, in some examples, as illustrated by FIG. 7A, within the same minimum repeating region 100, a third color sub-pixel block 113 of the first virtual rectangle 110 and a third color sub-pixel block 113 of the second virtual rectangle 120 are combined into a same sub-pixel, i.e., a third unitary sub-pixel block 113S; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a third color sub-pixel block 113 of the fourth virtual rectangle 140 of the first minimum repeating region 1001 and a third color sub-pixel block 113 of the third virtual rectangle 130 of the second minimum repeating region 1002 are combined into a same sub-pixel, i.e., a third unitary sub-pixel block 113S. Thus, combination of third color sub-pixel blocks into a same sub-pixel can reduce a difficulty in manufacturing process of the third color sub-pixel blocks. In addition, when the pixel arrangement structure is used in a display panel, it may be driven by using a Sub-pixel Rendering (SPR) algorithm to implement virtual display.

It should be noted that, the third color sub-pixel block of the first virtual rectangle and the third color sub-pixel block of the second virtual rectangle within the same minimum repeating region that are combined into a same sub-pixel, or the third color sub-pixel block of the fourth virtual rectangle of the first minimum repeating region and the third color sub-pixel block of the third virtual rectangle of the second minimum repeating region that are combined into a same sub-pixel as described above are driven to emit light as a same sub-pixel. That is to say, the above-described third color sub-pixel blocks located in different virtual rectangles that are combined into a same sub-pixel serve only as a portion of one sub-pixel, and at this time, a center of the integrated sub-pixel is located on the first edge or on the shared edge of the adjacent two minimum repeating regions in the second direction.

In addition, within the same one of the plurality of minimum repeating regions 100, the second color sub-pixel block 112 of the first virtual rectangle 110 and the second color sub-pixel block 112 of the second virtual rectangle 120 may not be combined into a same sub-pixel; within two adjacent ones of the plurality of minimum repeating regions 100 in the second direction, the two adjacent ones of the plurality of minimum repeating regions 100 in the second direction include a first minimum repeating region 1001 and a second minimum repeating region 1002 sequentially arranged in the second direction; and the second color sub-pixel block 112 of the fourth virtual rectangle 140 of the first minimum repeating region 1001 and the second color sub-pixel block 112 of the third virtual rectangle 130 of the second minimum repeating region 1002 may not be combined into a same sub-pixel. At this time, the second color sub-pixel block 112 of the first virtual rectangle 110 and the second color sub-pixel block 112 of the second virtual rectangle 120 are respectively driven to emit light as two second color sub-pixel blocks, and may share a same single color pattern region in a sub-pixel patterning process. The second color sub-pixel block 112 of the fourth virtual rectangle 140 of the first minimum repeating region 1001 and the second color sub-pixel block 112 of the third virtual rectangle 130 of the second minimum repeating region 1002 are respectively driven to emit light as two second color sub-pixel blocks, and may share a same single color pattern region in a sub-pixel patterning process.

In addition, within the same minimum repeating region 100, the third color sub-pixel block 113 of the first virtual rectangle 110 and the third color sub-pixel block 113 of the second virtual rectangle 120 may not be combined into a same sub-pixel; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and the third color sub-pixel block 113 of the fourth virtual rectangle 140 of the first minimum repeating region 1001 and the third color sub-pixel block 113 of the third virtual rectangle 130 of the second minimum repeating region 1002 may not be combined into a same sub-pixel. At this time, the third color sub-pixel block 113 of the first virtual rectangle 110 and the third color sub-pixel block 113 of the second virtual rectangle 120 are respectively driven to emit light as two third color sub-pixel blocks, and may share a same single color pattern region in a sub-pixel patterning process. The third color sub-pixel block 113 of the fourth virtual rectangle 140 of the first minimum repeating region 1001 and the third color sub-pixel block 113 of the third virtual rectangle 130 of the second minimum repeating region 1002 are respectively driven to emit light as two third color sub-pixel blocks, and may share a same single color pattern region in a sub-pixel patterning process. For example, in some examples, as illustrated by FIG. 7A, within the same minimum repeating region 100, a first color sub-pixel block 111 of the third virtual rectangle 130 and a first color sub-pixel block 111 of the fourth virtual rectangle 140 share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the third virtual rectangle 130 and a light-emitting layer of the first color sub-pixel block 111 of the fourth virtual rectangle 140 may be formed through a same opening on a mask. Of course, the above-described sub-pixel patterning process includes, but is not limited to, an evaporation process, and may also include printing, a color filter patterning process, and so on. Thus, the first color sub-pixel block 111 of the third virtual rectangle 130 and the first color sub-pixel block 111 of the fourth virtual rectangle 140 share a same single color pattern region in a sub-pixel patterning process such as printing and a color filter patterning process.

Figure 7B:
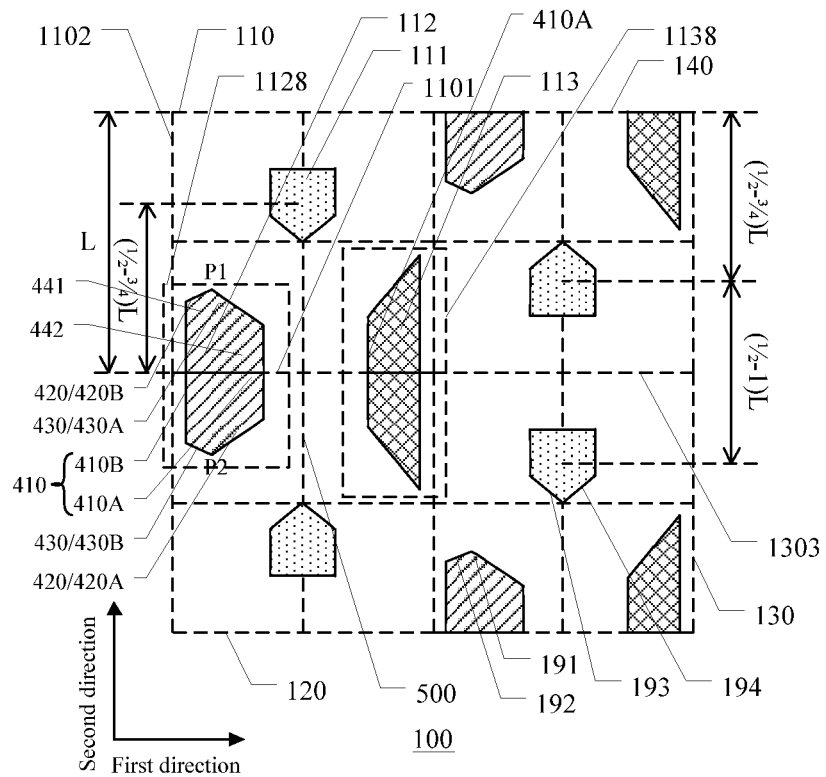
FIG. 7B is a schematic diagram of another pixel arrangement structure provided by an embodiment of the present disclosure.

For example, as illustrated by FIG. 5, FIG. 6, and FIG. 7B, a shape of at least one of the second unitary sub-pixel block 1128 and the third unitary sub-pixel block 1138 includes a parallel edge group 410, the parallel edge group 410 includes two parallel edges 410A, 410B, which are both approximately parallel to one of the first direction and the second direction, and the two parallel edges 410A, 410B have different lengths.

For example, as illustrated by FIG. 5, FIG. 6, and FIG. 7B, the shape of at least one of the second unitary sub-pixel block 1128 and the third unitary sub-pixel block 1138 is approximately symmetrical with respect to a line extending in the other one of the first direction and the second direction.

For example, as illustrated by FIG. 6 and FIG. 7B, a shape of at least one of the second unitary sub-pixel block 1128 and the third unitary sub-pixel block 1138 includes a hexagon, the hexagon includes a parallel edge group 410 including two parallel edges 410A, 410B, a first opposite edge group 420 including two opposite edges 420A, 420B, and a second opposite edge group 430 including two opposite edges 430A, 430B, the two opposite edges 420A, 420B in the first opposite edge group 420 are disposed opposite to each other, the two opposite edges 430A, 430B in the second opposite edge group 430 are disposed opposite to each other, and the two parallel edges 410A, 410B in the parallel edge group 410 have different lengths.

It is to noted that, the opposite edges are edges which are disposed opposite to each other; the opposite edges are not directly adjacent to each other; and the opposite edges may be parallel to each other, or an included angle between extending lines of the opposite edges is smaller than 90 degrees (for example, smaller than 45 degrees). For example, with regard to a hexagon, in a clockwise direction, a first edge, a second edge, a third edge, a fourth edge, a fifth edge, and a sixth edge are sequentially arranged; in this case, the first edge and the fourth edge are the opposite edges, the second edge and the fifth edge are the opposite edges, the third edge and the sixth edge are the opposite edges. For another example, with regard to octagon, in a clockwise direction, a first edge, a second edge, a third edge, a fourth edge, a fifth edge, a sixth edge, a seventh edge, an eighth edge, a ninth edge, and a tenth edge are sequentially arranged; in this case, the first edge and the fifth edge are the opposite edges, the second edge and the sixth edge are the opposite edges, the third edge and the seventh edge are the opposite edges, and the fourth edge and the eighth edge are the opposite edges.

For example, as illustrated by FIG. 6 and FIG. 7B, the hexagon is symmetrical with respect to a line extending in the first direction.

In some examples, within the same one of the plurality of minimum repeating regions 100, the two parallel edges in the parallel edge group of at least one of the second unitary sub-pixel block 1128 and the third unitary sub-pixel block 1138 in the first virtual rectangle 110 and the second virtual rectangle 120 are approximately parallel to the second direction, one of the two parallel edges in the parallel edge group which is close to a center line passing through a center of the first color sub-pixel block 111 in the first virtual rectangle 110 is a first parallel edge 410A, and one of the two parallel edges in the parallel edge group which is away from the center line passing through the center line of the first color sub-pixel block 111 in the first virtual rectangle is a second parallel edge 410B, a length of the first parallel edge 410A is smaller than a length of the second parallel edge 410B; within two adjacent ones of the plurality of minimum repeating regions 100 in the second direction, the two adjacent ones of the plurality of minimum repeating regions 100 comprise a first minimum repeating region 1001 and a second minimum repeating region 1002 sequentially arranged in the second direction; the two parallel edges in the parallel edge group of the second unitary sub-pixel block 1128 and the third unitary sub-pixel block 1138 in the third virtual rectangle 130 of the first minimum repeating region 1001 and the fourth virtual rectangle 140 of the second minimum repeating region 1002 are approximately parallel to the second direction, one of the two parallel edges in the parallel edge group which is close to a center line passing through a center of the first color sub-pixel block 111 in the third virtual rectangle 130 of the first minimum repeating region 1001 is a first parallel edge 410A, and one of the two parallel edges in the parallel edge group which is away from the center line passing through the center line of the first color sub-pixel block 111 in the third virtual rectangle 130 of the first minimum repeating region 1001 is a second parallel edge 410B, a length of the first parallel edge 410A is smaller than a length of the second parallel edge 410B.

However, the embodiments of the present disclosure are not limited thereto. Referring to FIG. 7D, the length of the first parallel edge 410A can also be larger than the length of the second parallel edge 410B.

For example, as illustrated by FIG. 6 and FIG. 7B, the two parallel edges 410A, 410B in the parallel edge group 410 are approximately parallel to the second direction, one of the two parallel edges 410A, 410B in the parallel edge group 410 which is close to a center line 500 passing through a center of the first color sub-pixel block and parallel to the second direction is a first parallel edge 410A, and one of the two parallel edges 410A, 410B in the parallel edge group 410 which is away from the center line passing through the center line 500 of the first color sub-pixel block and parallel to the second direction is a second parallel edge 410B, a length of the first parallel edge 410A is smaller than a length of the second parallel edge 410B. It should be noted that, the center line 500 can be a brightness line of the first color sub-pixel block.

In some examples, a shape of the second unitary sub-pixel block and a shape of the third unitary sub-pixel block both include the hexagon; within the same one of the plurality of minimum repeating regions, a distance between the first parallel edge of the hexagon of the second unitary sub-pixel block in the first virtual rectangle and the second virtual rectangle and the center line of the first color sub-pixel block in the first virtual rectangle is smaller than a distance between the first parallel edge of the hexagon of the third unitary sub-pixel block in the first virtual rectangle and the second virtual rectangle and the center line of the first color sub-pixel block in the first virtual rectangle, and a length of the first parallel edge of the hexagon of the second unitary sub-pixel block in the first virtual rectangle and the second virtual rectangle is smaller than a length of the first parallel edge of the hexagon of the third unitary sub-pixel block in the first virtual rectangle and the second virtual rectangle; or, a distance between the first parallel edge of the hexagon of the second unitary sub-pixel block in the first virtual rectangle and the second virtual rectangle and the center line of the first color sub-pixel block in the first virtual rectangle is larger than a distance between the first parallel edge of the hexagon of the third unitary sub-pixel block in the first virtual rectangle and the second virtual rectangle and the center line of the first color sub-pixel block in the first virtual rectangle, and a length of the first parallel edge of the hexagon of the second unitary sub-pixel block in the first virtual rectangle and the second virtual rectangle is larger than a length of the first parallel edge of the hexagon of the third unitary sub-pixel block in the first virtual rectangle and the second virtual rectangle.

In some examples, within two adjacent ones of the plurality of minimum repeating regions in the second direction, the two adjacent ones of the plurality of minimum repeating regions comprise a first minimum repeating region and a second minimum repeating region sequentially arranged in the second direction; a distance between the first parallel edge of the hexagon of the second unitary sub-pixel block in the third virtual rectangle of the first minimum repeating region and the fourth virtual rectangle of the second minimum repeating region and the center line of the first color sub-pixel block in the third virtual rectangle of the first minimum repeating region is smaller than a distance between the first parallel edge of the hexagon of the third unitary sub-pixel block in the third virtual rectangle of the first minimum repeating region and the fourth virtual rectangle of the second minimum repeating region and the center line of the first color sub-pixel block in the third virtual rectangle of the first minimum repeating region, and a length of the first parallel edge of the hexagon of the second unitary sub-pixel block in the third virtual rectangle of the first minimum repeating region and the fourth virtual rectangle of the second minimum repeating region is smaller than a length of the first parallel edge of the hexagon of the third unitary sub-pixel block in the third virtual rectangle of the first minimum repeating region and the fourth virtual rectangle of the second minimum repeating region; or, a distance between the first parallel edge of the hexagon of the second unitary sub-pixel block in the third virtual rectangle of the first minimum repeating region and the fourth virtual rectangle of the second minimum repeating region and the center line of the first color sub-pixel block in the third virtual rectangle of the first minimum repeating region is larger than a distance between the first parallel edge of the hexagon of the third unitary sub-pixel block in the third virtual rectangle of the first minimum repeating region and the fourth virtual rectangle of the second minimum repeating region and the center line of the first color sub-pixel block in the third virtual rectangle of the first minimum repeating region, and a length of the first parallel edge of the hexagon of the second unitary sub-pixel block in the third virtual rectangle of the first minimum repeating region and the fourth virtual rectangle of the second minimum repeating region is larger than a length of the first parallel edge of the hexagon of the third unitary sub-pixel block in the third virtual rectangle of the first minimum repeating region and the fourth virtual rectangle of the second minimum repeating region.

For example, as illustrated by FIG. 6 and FIG. 7B, a shape of the second unitary sub-pixel block and a shape of the third unitary sub-pixel block both include the hexagon, a distance between the first parallel edge 410A of the hexagon of the second unitary sub-pixel block 1128 and the center line 500 is smaller than a distance between the first parallel edge 410A of the hexagon of the third unitary sub-pixel block 1138 and the center line 500, and a length of the first parallel edge 410A of the hexagon of the second unitary sub-pixel block 1128 is smaller than a length of the first parallel edge 410A of the hexagon of the third unitary sub-pixel block 1138. Thus, upon the second unitary sub-pixel block emitting red light, the second unitary sub-pixel block can be closer to the center line 500, i.e., a brightness line of the first color sub-pixel block, so as to reduce the grain feeling of vertical line, thus improving the display effect.

Certainly, the embodiments of the present disclosure include but are not limited thereto. Referring to FIG. 7E, A distance between the first parallel edge 410A of the hexagon of the second unitary sub-pixel block 1128 and the center line can be larger than a distance between the first parallel edge 410A of the hexagon of the third unitary sub-pixel block 113 and the center line, and a length of the first parallel edge 410A of the hexagon of the second unitary sub-pixel block 1128 can be larger than a length of the first parallel edge 410A of the hexagon of the third unitary sub-pixel block 1138.

Figure 7C:
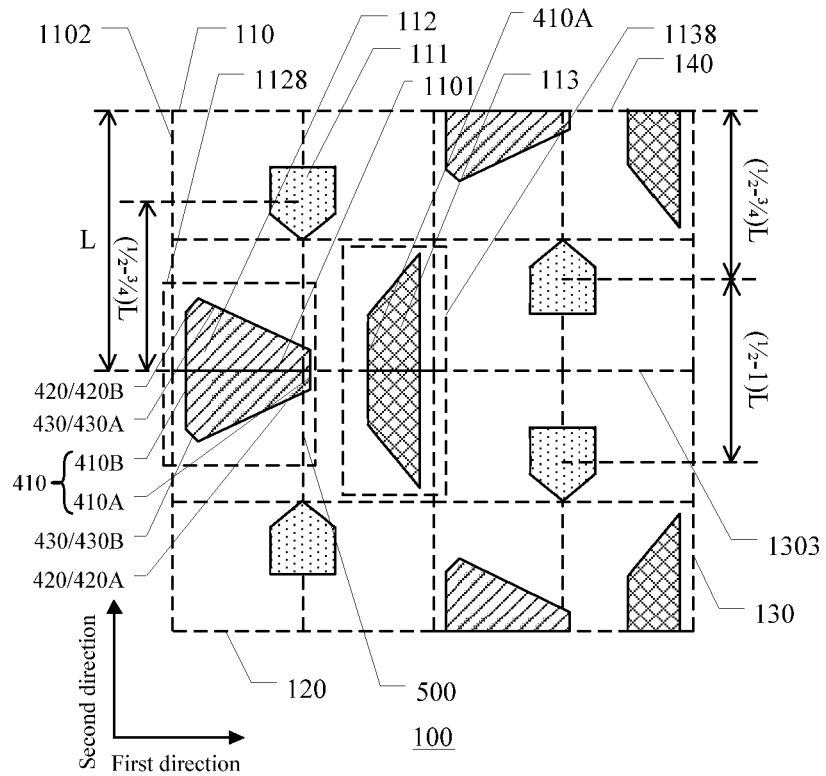
FIG. 7C is a schematic diagram of another pixel arrangement structure provided by an embodiment of the present disclosure.
Figure 7D:
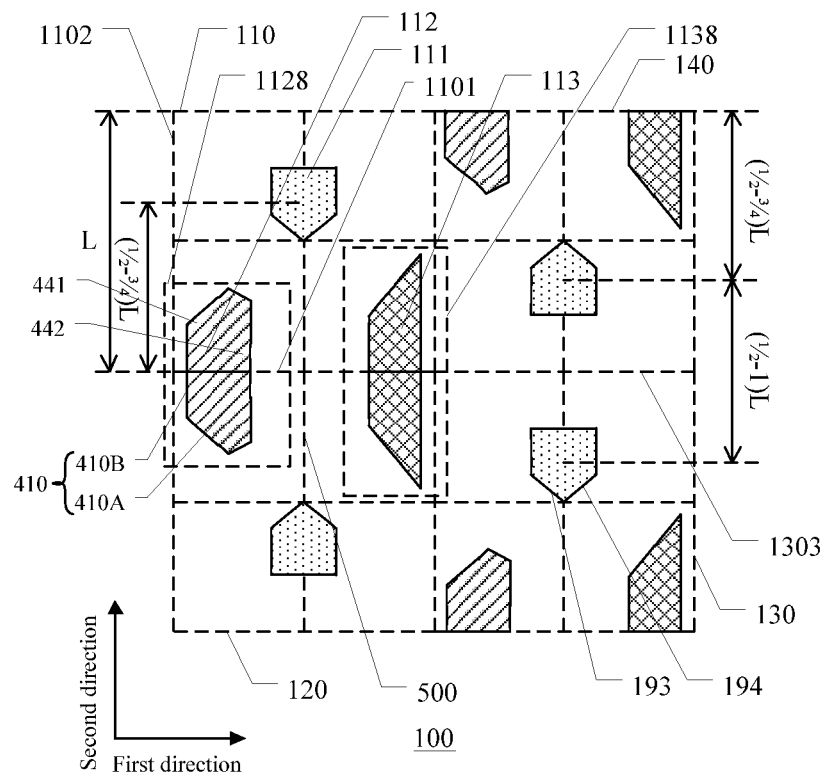
FIG. 7D is a schematic diagram of another pixel arrangement structure provided by an embodiment of the present disclosure.
Figure 7E:
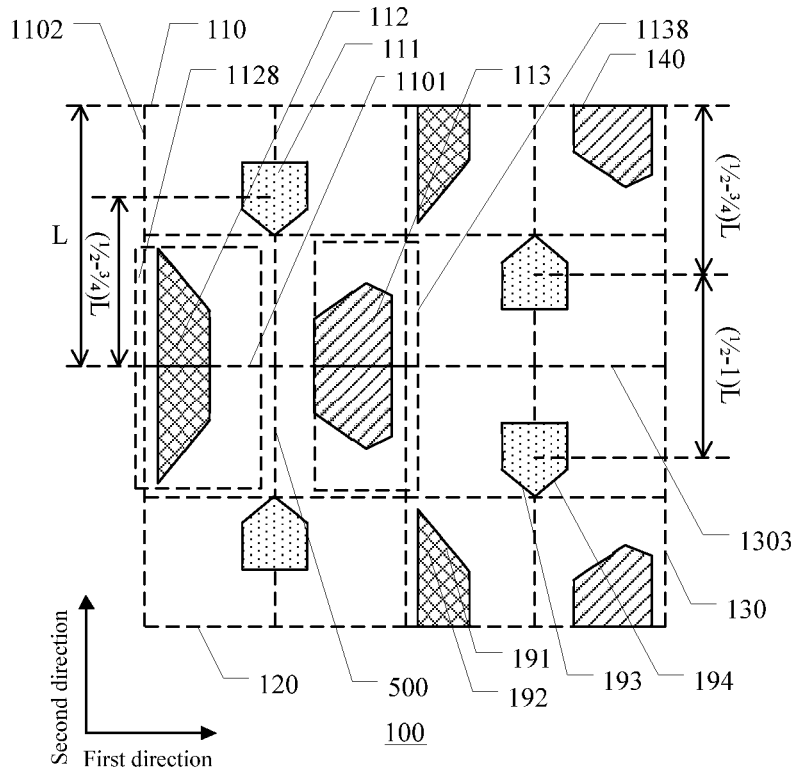
FIG. 7E is a schematic diagram of another pixel arrangement structure provided by an embodiment of the present disclosure.

For example, as illustrated by FIG. 7C, a shape of the second unitary sub-pixel block 1128 and a shape of the third unitary sub-pixel block 1138 both include the hexagon, the first parallel edge of the hexagon of the second unitary sub-pixel block in the first virtual rectangle 120 and the second virtual rectangle 130 goes beyond the center line of the first color sub-pixel block 111 in the first virtual rectangle 110. Thus, upon the second unitary sub-pixel block emits red light, the second unitary sub-pixel block can be closer to the center line 500, i.e., a brightness line of the first color sub-pixel block, so as to reduce the grain feeling of vertical line, thus improving the display effect. However, the embodiments of the present disclosure include but are not limited thereto, the first parallel edge of the hexagon of the third unitary sub-pixel block in the first virtual rectangle and the second virtual rectangle goes beyond the center line of the first color sub-pixel block in the first virtual rectangle.

For example, as illustrated by FIG. 2, FIG. 6 and FIG. 7B, the shape of at least one of the second unitary sub-pixel block 1128 and the third unitary sub-pixel block 1138 includes a polygon, for example, a hexagon, the polygon includes two vertexes P1, P2 which have the largest distance in the second direction, and a line connecting the two vertexes P1, P2 is approximately parallel to the second direction.

For example, as illustrated by FIG. 2, FIG. 6 and FIG. 7B, in the polygon of at least one of the second unitary sub-pixel block 1128 and the third unitary sub-pixel block 1138, an area of a first portion 441 located at a first side (for example, the left side) of the line connecting the two vertexes P1, P2 is different from an area of a second portion 442 located at a second side (for example, the right side) of the line connection the two vertexes P1, P2.

For example, as illustrated by FIG. 2, FIG. 6 and FIG. 7B, the first portion 441 is located at a side close to the first color sub-pixel block 111 located in the same virtual rectangle, and the second portion 442 is located at a side away from the first color sub-pixel block 111 located in the same virtual rectangle.

For example, as illustrated by FIG. 2, FIG. 6 and FIG. 7B, a ratio of the area of the first portion 441 and the area of the second portion 442 is in a range of 0-1. For example, a ratio of the area of the first portion 441 to the area of the second portion 442 is in a range of 0-1; for another example, a ratio of the area of the second portion 442 and the area of the first portion 441 is in a range of 0-1.

For example, as illustrated by FIG. 2, FIG. 6 and FIG. 7B, a width of the first portion 441 in the first direction is different from a width of the second portion 442 in the second direction.

For example, as illustrated by FIG. 2, FIG. 6 and FIG. 7B, a ratio of the width of the first portion 441 in the first direction and the width of the second portion 442 in the second direction is 0.1-6.

For example, upon the third color sub-pixel block having a shape of right-base-angle symmetrical pentagon, the third unitary sub-pixel block has a shape of hexagon.

In some examples, as illustrated by FIG. 7A, within the same one of the plurality of minimum repeating regions 100, a distance between a center of the first color sub-pixel block 111 of the third virtual rectangle 130 and a center of the first color sub-pixel block 111 of the fourth virtual rectangle 140 is 0.2-0.9 times of the length of the first edge; within two adjacent ones of the plurality of minimum repeating regions 100 in the second direction, the two adjacent ones of the plurality of minimum repeating regions include a first minimum repeating region and a second minimum repeating region sequentially arranged in the second direction; and a distance between a center of the first color sub-pixel block 111 of the first virtual rectangle 110 of the first minimum repeating region and a center of the first color sub-pixel block 111 of the second virtual rectangle 120 of the second minimum repeating region is 0.2-0.9 times of the length of the first edge. Thus, the distance between two first color sub-pixel blocks in two adjacent rows is relatively large, so as to reduce the sawtooth feeling of green horizontal line and grain feeling of vertical line, thus improving the display effect.

In some examples, as illustrated by FIG. 7A, within the same one of the plurality of minimum repeating regions, a distance between a center of the first color sub-pixel block of the third virtual rectangle and a center of the first color sub-pixel block of the fourth virtual rectangle is 0.5-0.7 times, for example, 0.59 times, of the length of the first edge; within two adjacent ones of the plurality of minimum repeating regions in the second direction, the two adjacent ones of the plurality of minimum repeating regions include a first minimum repeating region and a second minimum repeating region sequentially arranged in the second direction; and a distance between a center of the first color sub-pixel block of the first virtual rectangle of the first minimum repeating region and a center of the first color sub-pixel block of the second virtual rectangle of the second minimum repeating region is 0.5-0.7 times, for example, 0.59 times, of the length of the first edge. Thus, the distance between two first color sub-pixel blocks in two adjacent rows is relatively large, so as to further reduce the sawtooth feeling of green horizontal line and grain feeling of vertical line, thus improving the display effect.

For example, as illustrated by FIG. 7A, within the same one of the plurality of minimum repeating regions 100, a distance between a center of the first color sub-pixel block 111 of the first virtual rectangle 110 and a center of the first color sub-pixel block 111 of the second virtual rectangle 120 is 1.1-1.8 times of the length of the first edge; within two adjacent ones of the plurality of minimum repeating regions 100 in the second direction, the two adjacent ones of the plurality of minimum repeating regions include a first minimum repeating region and a second minimum repeating region sequentially arranged in the second direction; and a distance between a center of the first color sub-pixel block 111 of the third virtual rectangle 130 of the first minimum repeating region and a center of the first color sub-pixel block 111 of the fourth virtual rectangle 140 of the second minimum repeating region is 1.1-1.8 times of the length of the first edge. Thus, the distance between two first color sub-pixel blocks in the same row is relatively small, so as to reduce the sawtooth feeling of green horizontal line and grain feeling of vertical line, thus improving the display effect.

For example, as illustrated by FIG. 7A, within the same one of the plurality of minimum repeating regions, a distance between a center of the first color sub-pixel block of the first virtual rectangle and a center of the first color sub-pixel block of the second virtual rectangle is 1.3-1.5 times, for example, 1.4 times, of the length of the first edge; within two adjacent ones of the plurality of minimum repeating regions in the second direction, the two adjacent ones of the plurality of minimum repeating regions include a first minimum repeating region and a second minimum repeating region sequentially arranged in the second direction; and a distance between a center of the first color sub-pixel block of the third virtual rectangle of the first minimum repeating region and a center of the first color sub-pixel block of the fourth virtual rectangle of the second minimum repeating region is 1.3-1.5 times, for example, 1.4 times, of the length of the first edge. Thus, the distance between two first color sub-pixel blocks in the same row is relatively small, so as to reduce the sawtooth feeling of green horizontal line and grain feeling of vertical line, thus improving the display effect.

For example, in some examples, as illustrated by FIG. 7A, an organic light-emitting layer of the first color sub-pixel block 111 of the third virtual rectangle 130 and an organic light-emitting layer of the first color sub-pixel block 111 of the fourth virtual rectangle 140 are evaporated through a same opening on a fine metal mask.

For example, in some examples, as illustrated by FIG. 7A, within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a first color sub-pixel block 111 of the first virtual rectangle 110 of the first minimum repeating region 1001 and a first color sub-pixel block 111 of the second virtual rectangle 120 of the second minimum repeating region 1002 may share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the first virtual rectangle 110 of the first minimum repeating region 1001 and a light-emitting layer of the first color sub-pixel block 111 of the second virtual rectangle 120 of the second minimum repeating region 1002 may be formed through a same opening on the mask, that is to say, the first color sub-pixel block 111 of the first virtual rectangle 110 of the first minimum repeating region 1001 and the first color sub-pixel block 111 of the second virtual rectangle 120 of the second minimum repeating region 1002 include the light-emitting layers formed through the same opening on the mask. Of course, the above-described sub-pixel patterning process includes, but is not limited to, an evaporation process, and may also include printing, a color filter patterning process, and so on. Thus, the first color sub-pixel block 111 of the first virtual rectangle 110 of the first minimum repeating region 1001 and the first color sub-pixel block 111 of the second virtual rectangle 120 of the second minimum repeating region 1002 share a same single color pattern region in a sub-pixel patterning process such as printing and a color filter patterning process. Therefore, combination of first color sub-pixel blocks into a same sub-pixel can reduce a process difficulty in fabricating the first color sub-pixel block.

For example, in some examples, as illustrated by FIG. 7A, within the same minimum repeating region 100, a distance between a center of the second color sub-pixel block 112 and a center of the third color sub-pixel block 113 in the first virtual rectangle 110 ranges from 5/8 to 7/8 of the length of the first edge, so that it can be ensured that a distance from the third color sub-pixel blocks 113 of the first virtual rectangle 110 and the second virtual rectangle 120 to second color sub-pixel blocks 112 of a first virtual rectangle 110 and a second virtual rectangle 120 of an adjacent minimum repeating region in the first direction is sufficiently large, so that it is convenient to form the first color sub-pixel block 111 of the third virtual rectangle 130 and the first color sub-pixel block 111 of the fourth virtual rectangle 140 within the same minimum repeating region 100 through a same opening on the mask, and to form the first color sub-pixel block 111 of the first virtual rectangle 110 of the first minimum repeating region 1001 and the first color sub-pixel block 111 of the second virtual rectangle 120 of the second minimum repeating region 1002 through a same opening on the mask, so as to reduce a difficulty in process.

In addition, as viewed from a relationship between respective virtual rectangles and the minimum repeating region of FIG. 7A, a step of the minimum repeating region in the first direction is approximately equal to edge lengths of two virtual rectangles, that is, the step of the minimum repeating region in the first direction is about 2L. As illustrated by FIG. 7A, the second color sub-pixel block and the third color sub-pixel block in the first virtual rectangle 110 and the second color sub-pixel block and the third color sub-pixel block in the second virtual rectangle 120 may be combined into one second color sub-pixel block and one third color sub-pixel block, which, plus one first color sub-pixel block in the third virtual rectangle 130 and one first color sub-pixel block in the fourth virtual rectangle 130, may form a repeating unit. That is to say, a size of the repeating unit in the first direction or a step of the repeating unit in the first direction is twice the length of the edge of the virtual rectangle in the first direction. If the virtual rectangle is a square, then the step of the minimum repeating unit in the first direction is approximately 2L.

As can be seen from FIG. 7A, the second color sub-pixel block and the third color sub-pixel block have elongated shapes, that is, elongated shapes extending in the second direction. In addition, the second color sub-pixel block and the third color sub-pixel block may also have elliptical shapes. With respect to the second color sub-pixel block, if it is divided into two portions (the two portions are, for example, the second color sub-pixel block located in the first virtual rectangle 110 and the second color sub-pixel block located in the second virtual rectangle) by a center line along the first direction, then a distance between centers of the two second color sub-pixel blocks is less than 0.3L. In addition, a size of the second color sub-pixel block in the second direction is less than 0.6L.

With respect to the second color sub-pixel block and the third color sub-pixel block, a ratio of a size in the second direction to a size in the first direction is y, and y>1. That is to say, the second color sub-pixel block and the third color sub-pixel block have elongated shapes extending in the second direction.

For example, the second color sub-pixel is a red sub-pixel, and the third color sub-pixel is a blue sub-pixel. A lifetime of the red sub-pixel is usually longer than that of the blue sub-pixel. Therefore, an area of the red sub-pixel may be smaller than an area of the blue sub-pixel; however, a ratio of a size in the first direction to a size in the second direction of the red sub-pixel cannot be too small; if it is too small, a marked difference between a lateral direction and a longitudinal direction may be affected.

Figure 7F:
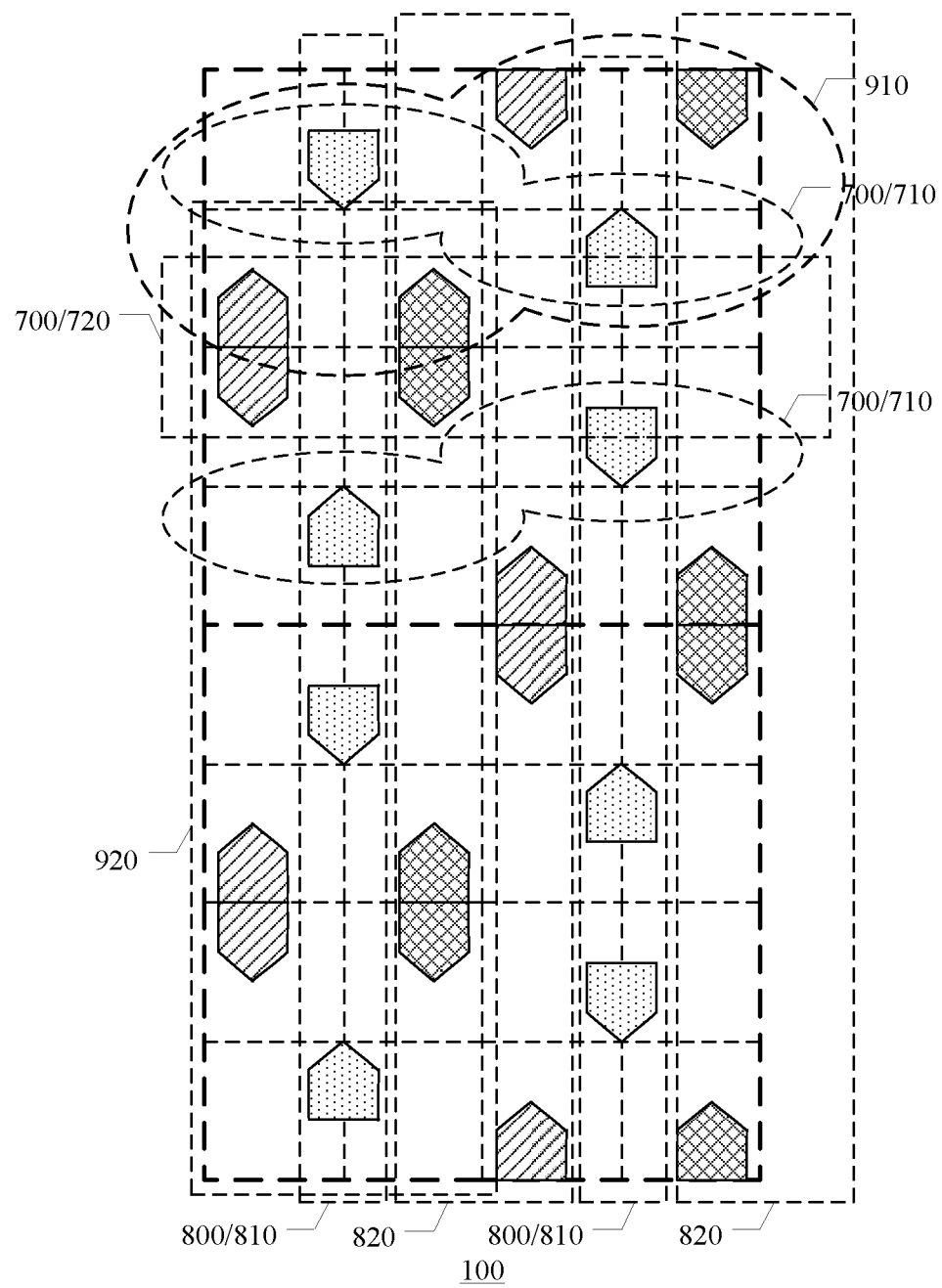
FIG. 7F is a schematic diagram of another pixel arrangement structure provided by an embodiment of the present disclosure.
Figure 7G:
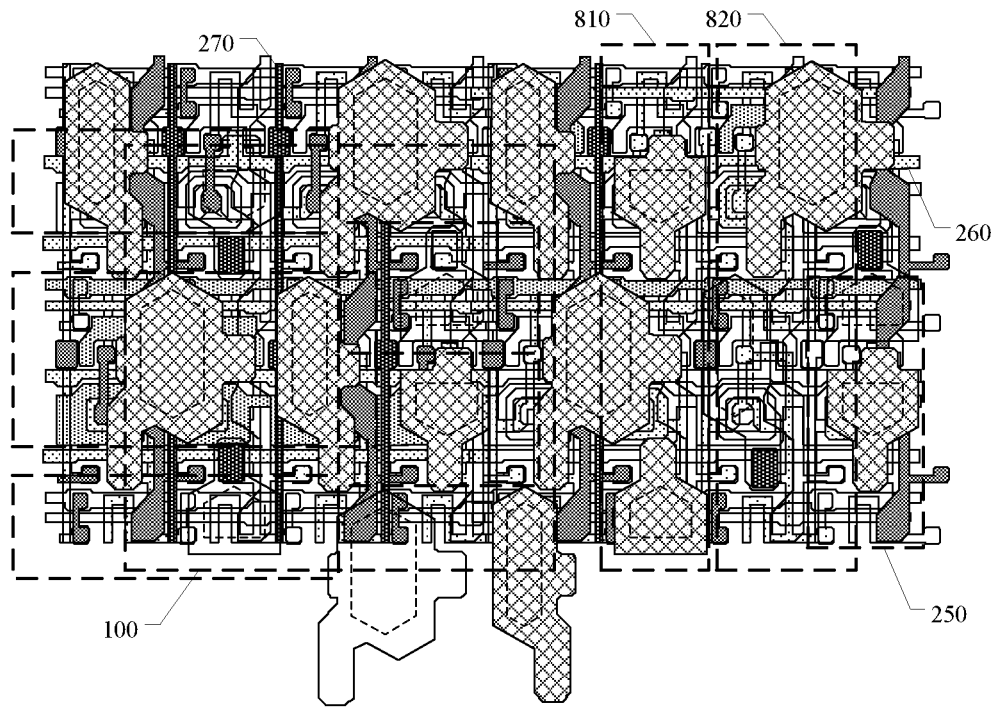
FIG. 7G is a schematic diagram of another pixel arrangement structure provided by an embodiment of the present disclosure

For example, as illustrated by FIG. 7F and FIG. 7G, the first color sub-pixel blocks 111 in virtual rectangles belonging to the same row are located in a first sub-pixel row 710, each of the plurality of minimum repeating regions 100 includes two first sub-pixel rows 710, and a second sub-pixel row 720 is provided between the two first sub-pixel rows 710, the second sub-pixel row 720 includes multiple second color sub-pixel blocks 112 and multiple third color sub-pixel blocks 113 alternately arranged in the first direction, and multiple first sub-pixel rows 710 and multiple second sub-pixel rows 720 are alternately arranged in the second direction; the first color sub-pixel blocks 111 in the first sub-pixel row 710 are controlled by the same row of pixel circuits 250 (for example, the anodes used for driving the first color sub-pixel blocks 111 in the first sub-pixel row 710 are electrically connected the pixel circuits 250 of the same row), so as to be controlled by one gate line 260, and the second color sub-pixel blocks 112 and the third color sub-pixel blocks 113 in the second sub-pixel row 720 are also controlled by the same row of pixel circuits 250 (for example, the anodes used for driving the second color sub-pixel blocks 112 and the third color sub-pixel blocks 113 in the second sub-pixel row 720 are electrically connected the pixel circuits 250 of the same row), so as to be controlled by one gate line 260.

For example, as illustrated by FIG. 7G, the first color sub-pixel blocks 111 in the first sub-pixel row 710 and the second color sub-pixel blocks 112 and the third color sub-pixel blocks 113 in the second sub-pixel row 720 which is adjacent to the first sub-pixel row 710 may be controlled by the same row of pixel circuits 250. So that, in the present disclosure, four sub-pixel rows 700 (including two first sub-pixel rows 710 and two second sub-pixel rows 720) can be controlled by two rows of pixel circuits.

For example, as illustrated by FIGS. 7F and 4G, the first color sub-pixel blocks 111 in virtual rectangles belonging to the same column are located in a first sub-pixel column 810, each of the plurality of minimum repeating regions 100 includes two first sub-pixel columns 810, and a second sub-pixel column 820 is provided between the two first sub-pixel columns 810, the second sub-pixel column 820 includes multiple second color sub-pixel blocks 112 and multiple third color sub-pixel blocks 113 alternately arranged in the second direction, and multiple first sub-pixel columns 810 and multiple second sub-pixel columns 820 are alternately arranged in the first direction. The first color sub-pixel blocks 111 in the first sub-pixel column are controlled by the same column of pixel circuits 250 (for example, the anodes used for driving the first color sub-pixel blocks 111 in the first sub-pixel column 810 are electrically connected the pixel circuits 250 of the same column), so as to be driven by one data line 270, and the second color sub-pixel blocks 112 and the third color sub-pixel blocks 113 in the second sub-pixel column 820 are also controlled by the same column of pixel circuits 250 (for example, the anodes used for driving the second color sub-pixel blocks 112 and the third color sub-pixel blocks 113 in the second sub-pixel column 820 are electrically connected the pixel circuits 250 of the same column), so as to be controlled by one data line 270.

For example, as illustrated by FIG. 7F, each of the plurality of minimum repeating regions 100 averagely includes four sub-pixel rows 700 (including two first sub-pixel row 710 and two second sub-pixel row 720) and four sub-pixel columns 800 (including two first sub-pixel column 810 and two second sub-pixel column 820), and the four sub-pixel rows 700 and four sub-pixel columns 800 constitute two pixel rows 910 and two pixel columns 920. In this way, a ratio of the number of the sub-pixel rows to the number of the pixel rows in the second direction is substantially the same as a ratio of the number of the sub-pixel columns to the number of the pixel columns in the first direction.

It is to be noted that, in the first direction, the number of the sub-pixels averagely distributed each pixel is ⅔ of the number of RGB sub-pixels needed by the pixel to achieve full-color display. Besides, in the second direction, the number of the sub-pixels averagely distributed each pixel is ⅔ of the number of RGB sub-pixels needed by the pixel to achieve full-color display.

Figure 8:
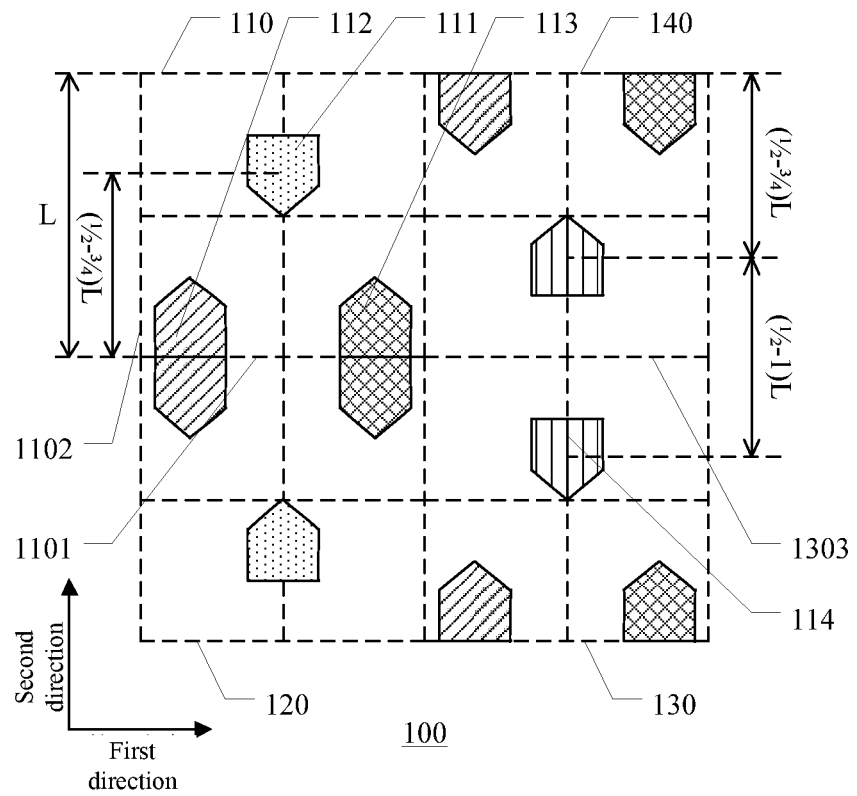
FIG. 8 is a schematic diagram of another pixel arrangement structure provided by an embodiment of the present disclosure.

FIG. 8 is a pixel arrangement structure provided by an embodiment of the present disclosure. As illustrated by FIG. 8, first color sub-pixel blocks 111 in a third virtual rectangle 130 and a fourth virtual rectangle 140 are replaced with fourth color sub-pixel blocks 114.

For example, the first color sub-pixel block 111 includes a green sub-pixel, and the fourth color sub-pixel block 114 includes a yellow sub-pixel. Therefore, a four-color mode of red, green, blue and yellow (RGBY) may be used in the pixel arrangement structure, so as to further improve display quality of the pixel arrangement structure.

Figure 9:
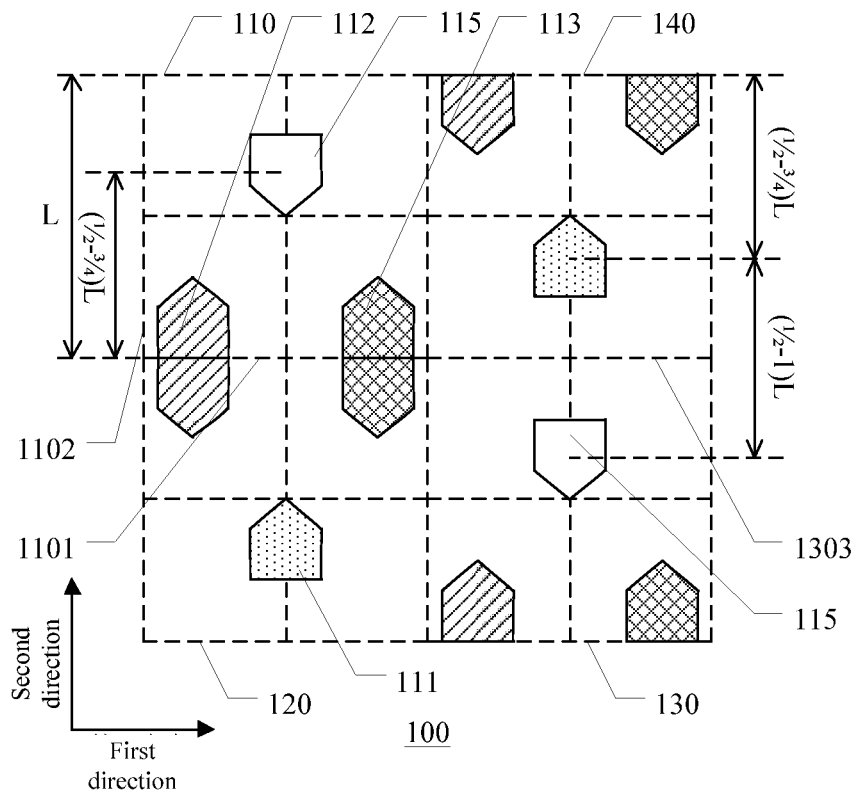
FIG. 9 is a schematic diagram of another pixel arrangement structure provided by an embodiment of the present disclosure.

FIG. 9 is a pixel arrangement structure provided by an embodiment of the present disclosure. As illustrated by FIG. 9, first color sub-pixel blocks 111 in a first virtual rectangle 110 and a third virtual rectangle 130 are replaced with fifth color sub-pixel blocks 115.

For example, the first color sub-pixel block 110 includes a green sub-pixel, and the fifth color sub-pixel block 115 includes a white sub-pixel. Therefore, a red, green, blue and white (RGBW) mode may be used in the pixel arrangement structure, so as to effectively improve brightness of the pixel arrangement structure and improve utilization efficiency of energy.

Figure 10:
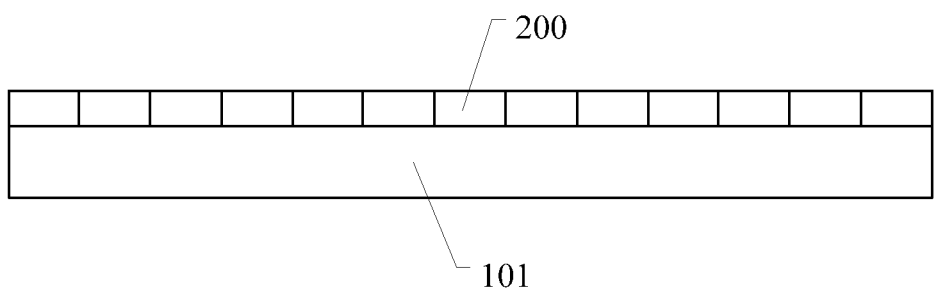
FIG. 10 is a structural schematic diagram of a display substrate provided by an embodiment of the present disclosure.

An embodiment of the present disclosure further provides a display substrate. FIG. 10 is the display substrate provided by the embodiment of the present disclosure. As illustrated by FIG. 10, the display substrate includes a base substrate 101 and a plurality of pixels 200 arranged on the base substrate 101. The plurality of pixels 200 may adopt the pixel arrangement structure provided by any one of the above-described examples. Because the display substrate may adopt the pixel arrangement structure provided by any one of the above-described examples, the display substrate has advantageous effects of the pixel arrangement structure included therein, for example, the display substrate can improve uniformity of distribution of first color sub-pixel blocks, so as to improve visual resolution and also improve display quality.

Figure 11:
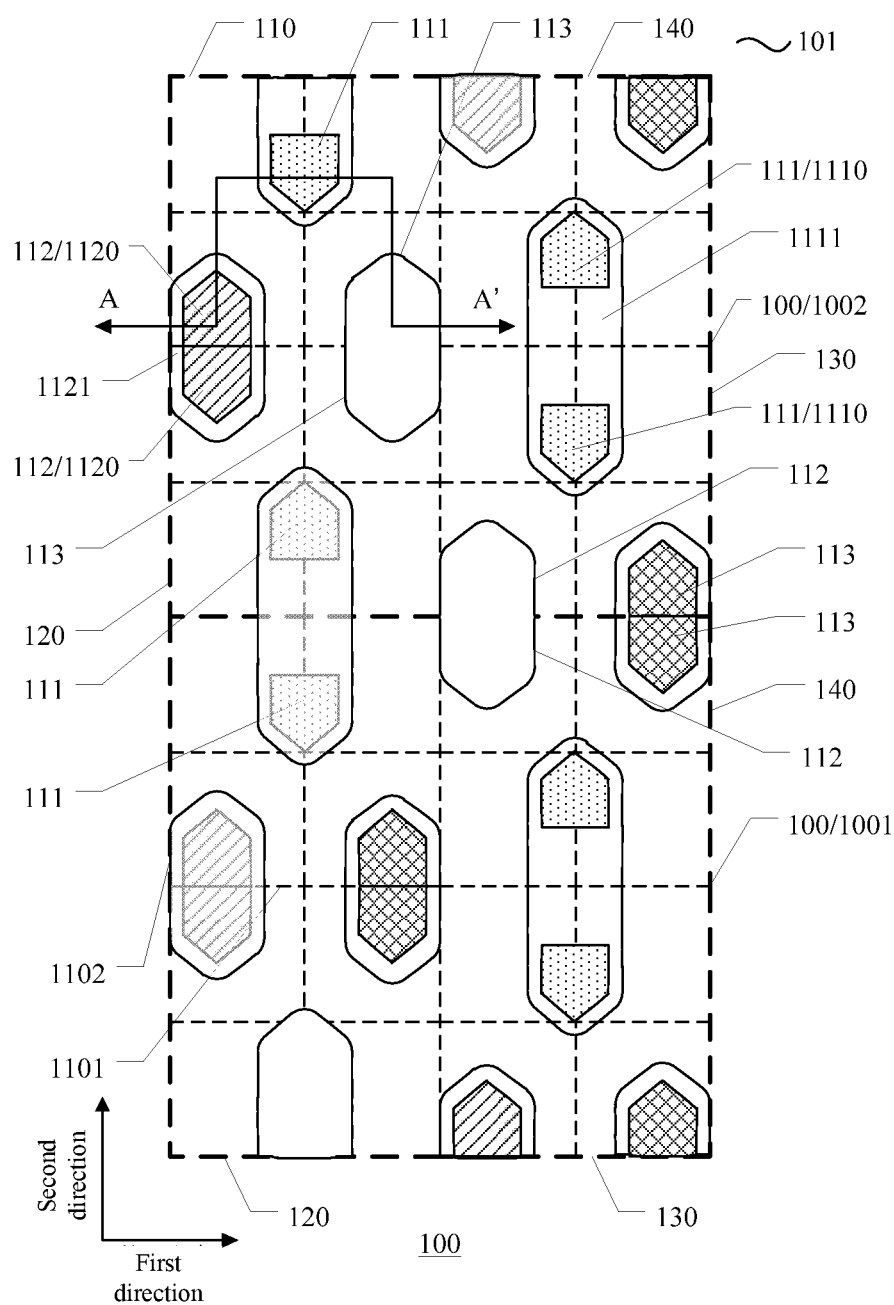
FIG. 11 is a partial schematic plan view of a display substrate provided by an embodiment of the present disclosure.
Figure 12:
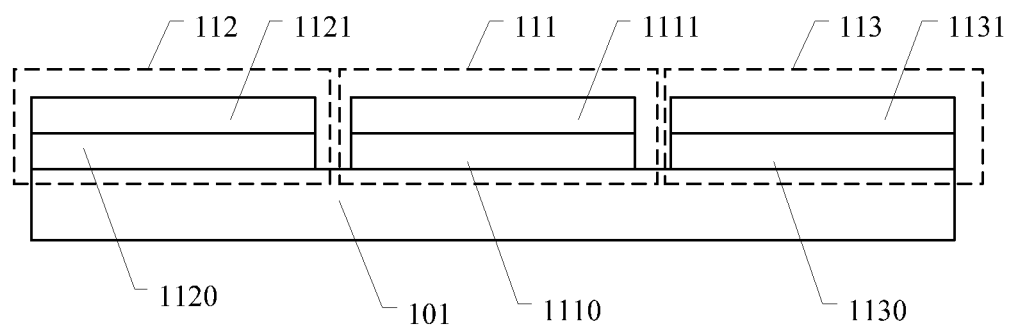
FIG. 12 is a cross-sectional schematic diagram of the display substrate taken along direction A-A' in FIG. 11 provided by the embodiment of the present disclosure.

FIG. 11 is a partial schematic plan view of another display substrate provided by an embodiment of the present disclosure. FIG. 12 is a cross-sectional schematic diagram of the display substrate taken along direction A-A' in FIG. 11 provided by the embodiment of the present disclosure. As illustrated by FIG. 11, a first color sub-pixel block 111 includes a first color pixel electrode 1110 and a first color light-emitting layer 1111 provided on the first color pixel electrode 1110, a second color sub-pixel block 112 includes a second color pixel electrode 1120 and a second color light-emitting layer 1121 provided on the second color pixel electrode 1120, and a third color sub-pixel block 113 includes a third color pixel electrode 1130 and a third color light-emitting layer 1131 provided on the third color pixel electrode 1130. Thus, the display substrate may be an array substrate.

For example, in some examples, the first color pixel electrode 1110 is configured to drive the first color light-emitting layer 1111 to emit light.

For example, a shape of the first color pixel electrode 1110 may be the same as a shape of the first color sub-pixel block 111. Of course, the embodiment of the present disclosure includes, but is not limited thereto, the shape of the first color pixel electrode 1110 may be different from the shape of the first color sub-pixel block 111, and the shape of the first color sub-pixel block 111 may be defined by a pixel defining layer.

It should be noted that, the shape of the above-described first color sub-pixel block is a shape of a light-emitting region of the first color sub-pixel block. In addition, a specific shape of the first color light-emitting layer may be set according to a preparation process, which will not be limited here in the embodiment of the present disclosure. For example, the shape of the first color light-emitting layer may be determined by a shape of an opening of a mask in the preparation process.

For example, the first color pixel electrode 1110 may be in contact with the first color light-emitting layer 1111, so that it can drive the light-emitting layer to emit light at a portion in contact with each other, and the portion where the first color pixel electrode 1110 and the first color light-emitting layer 1111 can be in contact with each other is an effective portion that a sub-pixel can emit light. Therefore, the shape of the above-described first color sub-pixel block is the shape of the light-emitting region of the first color sub-pixel block. In the embodiment of the present disclosure, the first color pixel electrode 1110 may be an anode, but is not limited to an anode, and a cathode of a light emitting diode may also be used as the pixel electrode.

For example, in some examples, the second color pixel electrode 1120 is configured to drive the second color light-emitting layer 1121 to emit light.

For example, a shape of the second color pixel electrode 1120 may be the same as a shape of the second color sub-pixel block 112. Of course, the embodiment of the present disclosure includes, but is not limited thereto, the shape of the second color pixel electrode 1120 may be different from the shape of the second color sub-pixel block 112, and the shape of the second color sub-pixel block 112 may be defined by a pixel defining layer.

It should be noted that, the shape of the above-described second color sub-pixel block is a shape of a light-emitting region of the second color sub-pixel block. In addition, a specific shape of the second color light-emitting layer may be set according to a preparation process, which will not be limited here in the embodiment of the present disclosure. For example, the shape of the second color light-emitting layer may be determined by a shape of an opening of a mask in the preparation process.

For example, the second color pixel electrode 1120 may be in contact with the second color light-emitting layer 1121, so that it can drive the light-emitting layer to emit light at a portion in contact with each other, and the portion where the second color pixel electrode 1120 and the second color light-emitting layer 1121 can be in contact with each other is an effective portion that a sub-pixel can emit light. Therefore, the shape of the above-described second color sub-pixel block is the shape of the light-emitting region of the second color sub-pixel block. In the embodiment of the present disclosure, the second color pixel electrode 1120 may be an anode, but is not limited to an anode, and a cathode of a light emitting diode may also be used as the pixel electrode.

For example, in some examples, the third color pixel electrode 1130 is configured to drive the third color light-emitting layer 1131 to emit light.

For example, a shape of the third color pixel electrode 1130 may be the same as a shape of the third color sub-pixel block 113. Of course, the embodiment of the present disclosure includes, but is not limited thereto, the shape of the third color pixel electrode 1130 may be different from the shape of the third color sub-pixel block 113, and the shape of the third color sub-pixel block 113 may be defined by a pixel defining layer.

It should be noted that, the shape of the above-described third color sub-pixel block is a shape of a light-emitting region of the third color sub-pixel block. In addition, a specific shape of the third color light-emitting layer may be set according to a preparation process, which will not be limited here in the embodiment of the present disclosure. For example, the shape of the third color light-emitting layer may be determined by a shape of an opening of a mask in the preparation process.

For example, the third color pixel electrode 1130 may be in contact with the third color light-emitting layer 1131, so that it can drive the light-emitting layer to emit light at a portion in contact with each other, and the portion where the third color pixel electrode 1130 and the third color light-emitting layer 1131 can be in contact with each other is an effective portion that a sub-pixel can emit light. Therefore, the shape of the above-described third color sub-pixel block is the shape of the light-emitting region of the third color sub-pixel block. In the embodiment of the present disclosure, the third color pixel electrode 1130 may be an anode, but is not limited to an anode, and a cathode of a light emitting diode may also be used as the pixel electrode.

It should be noted that, with respect to each sub-pixel, an area of a pixel electrode may be slightly larger than an area of a light-emitting layer, or the area of the light-emitting layer may also be slightly larger than the area of the pixel electrode, which will not be particularly limited in the embodiment of the present disclosure. For example, the light-emitting layer here may include an electroluminescent layer itself as well as other functional layers located on both sides of the electroluminescent layer, for example, a hole injection layer, a hole transport layer, an electron injection layer, an electron transport layer, and so on. In some embodiments, a shape of a sub-pixel may also be defined by a pixel defining layer. For example, a lower electrode (e.g., an anode) of a light emitting diode may be provided below the pixel defining layer; the pixel defining layer includes an opening for defining the sub-pixel; the opening exposes a portion of the lower electrode; and when a light-emitting layer is formed in the opening in the above-described pixel defining layer, the light-emitting layer is in contact with the lower electrode, which can drive the light-emitting layer to emit light at the portion. Therefore, in this case, the opening of the pixel defining layer defines the shape of the sub-pixel.

For example, the shapes of the various sub-pixels as described in the embodiment of the present disclosure are all approximate shapes; and when the light-emitting layer or various electrode layers are formed, it cannot be ensured that an edge of a sub-pixel is a strict straight line and a corner thereof is a strict angle. For example, the light-emitting layer may be formed by using an evaporation process with a mask, and thus, its corner portion may have a rounded shape. In some cases, a draft angle is needed in a metal etching process, so when a light-emitting layer of a sub-pixel is formed by using an evaporation process, a corner of the light-emitting layer may be removed.

For example, in some examples, as illustrated by FIG. 11 and FIG. 12, within a same minimum repeating region 100, a first color light-emitting layer 1111 of a first color sub-pixel block 111 of a third virtual rectangle 130 and a first color light-emitting layer 1111 of a first color sub-pixel block 111 of a fourth virtual rectangle 140 may be formed by sharing a same single color pattern region, for example, formed through a same opening of a mask.

For example, in some examples, an area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than a sum of an area of a first color pixel electrode 1110 of the first color sub-pixel block 111 of the third virtual rectangle 130 and an area of a first color pixel electrode 1110 of the first color sub-pixel block 111 of the fourth virtual rectangle 140.

For example, in some examples, because a distance between a center of the first color sub-pixel block 111 of the third virtual rectangle 130 and a center of the first color sub-pixel block 111 of the fourth virtual rectangle 140 is larger than ½ of a length of a second edge 1102, the area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than 1.5 times the sum of the area of the first color pixel electrode 1110 of the first color sub-pixel block 111 of the third virtual rectangle 130 and the area of the first color pixel electrode 1110 of the first color sub-pixel block 111 of the fourth virtual rectangle 140.

For example, in some examples, as illustrated by FIG. 11 and FIG. 12, within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a first color light-emitting layer 1111 of a first color sub-pixel block 111 of a first virtual rectangle 110 within the first minimum repeating region 1001 and a first color light-emitting layer 1111 of a first color sub-pixel block 111 of a second virtual rectangle 120 within the second minimum repeating region 1002 may be formed by sharing a same single color pattern region, for example, formed through a same opening of the mask.

For example, in some examples, an area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than a sum of an area of a first color pixel electrode 1110 of the first color sub-pixel block 111 of the first virtual rectangle 110 within the first minimum repeating region 1001 and an area of a first color pixel electrode 1110 of the first color sub-pixel block 111 of the second virtual rectangle 120 within the second minimum repeating region 1002.

For example, because a distance between a center of the first color sub-pixel block 111 of the first virtual rectangle 110 within the first minimum repeating region 1001 and a center of the first color sub-pixel block 111 of the second virtual rectangle 120 within the second minimum repeating region 1002 is larger than ½ of the length of the second edge 1102, the area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than 1.5 times the sum of the area of the first color pixel electrode 1110 of the first color sub-pixel block 111 of the first virtual rectangle 110 within the first minimum repeating region 1001 and the area of the first color pixel electrode 1110 of the first color sub-pixel block 111 of the second virtual rectangle 120 within the second minimum repeating region 1002.

For example, in some examples, a first color sub-pixel block 111, a second color sub-pixel block 112 and a third color sub-pixel block 113 may separately serve as one sub-pixel for display; and a first color sub-pixel block 111, a second color sub-pixel block 112 and a third color sub-pixel block 113 in each virtual rectangle may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel block located in a different virtual rectangle into one sub-pixel, for example, at a shared edge of the adjacent virtual rectangle, for display. For example, a first edge 1101 passes through the combined sub-pixel, and the combined sub-pixel is symmetrical with respect to the first edge 1101. For example, in some examples, as illustrated by FIG. 11 and FIG. 12, within the same minimum repeating region 100, a second color pixel electrode 1120 of a second color sub-pixel block 112 of the first virtual rectangle 110 and a second color pixel electrode 1120 of a second color sub-pixel block 112 of the second virtual rectangle 120 are combined into a same pixel electrode, i.e., integrated into a unitary pixel electrode, so as to serve as one pixel electrode for loading a data signal to display a same grayscale. For example, in some examples, as illustrated by FIG. 11 and FIG. 12, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a second color pixel electrode 1120 of a second color sub-pixel block 112 of a fourth virtual rectangle 140 within the first minimum repeating region 1001 and a second color pixel electrode 1120 of a second color sub-pixel block 112 of a third virtual rectangle 130 within the second minimum repeating region 1002 are combined into a same pixel electrode, i.e., integrated into a unitary pixel electrode, so as to serve as one pixel electrode for loading a data signal to display a same grayscale.

For example, in some examples, as illustrated by FIG. 11 and FIG. 12, within the same minimum repeating region 100, a third color pixel electrode 1130 of a third color sub-pixel block 113 of the first virtual rectangle 110 and a third color pixel electrode 1130 of a third color sub-pixel block 113 of the second virtual rectangle 120 are combined into a same pixel electrode, i.e., integrated into a unitary pixel electrode, so as to serve as one pixel electrode for loading a data signal to display a same grayscale.

For example, in some examples, as illustrated by FIG. 11 and FIG. 12, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a third color pixel electrode 1130 of a third color sub-pixel block 113 of the fourth virtual rectangle 140 within the first minimum repeating region 1001 and a third color pixel electrode 1130 of a third color sub-pixel block 113 of the third virtual rectangle 130 within the second minimum repeating region 1002 are combined into a same pixel electrode, i.e., integrated into a unitary pixel electrode, so as to serve as one pixel electrode for loading a data signal to display a same grayscale.

Figure 13:
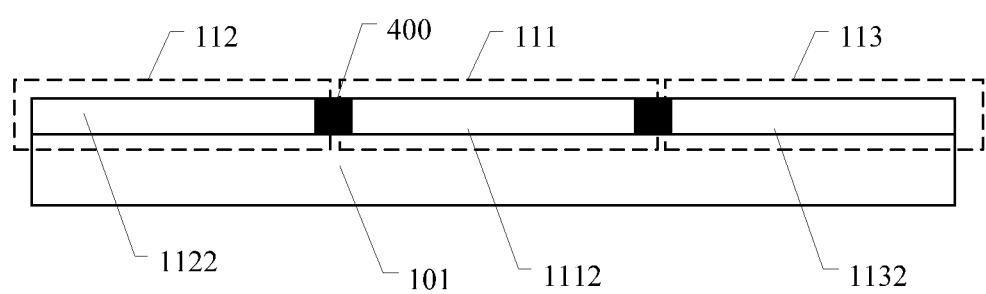
FIG. 13 is a cross-sectional schematic diagram of a display substrate taken along direction A-A' in FIG. 11 provided by an embodiment of the present disclosure.

FIG. 13 is a cross-sectional schematic diagram of another display substrate taken along direction A-A' in FIG. 11 provided by an embodiment of the present disclosure. As illustrated by FIG. 13, a first color sub-pixel block 111 includes a first color filter 1112, a second color sub-pixel block 112 includes a second color filter 1122, and a third color sub-pixel block 113 includes a third color filter 1132. Thus, the display substrate may be a color filter substrate. It should be noted that, when the display substrate is a color filter substrate, it is not only applicable to a liquid crystal display panel, but also applicable to a display panel in a mode combining a white light OLED with a color filter.

For example, in some examples, as illustrated by FIG. 13, the display substrate further includes a black matrix 400 provided among the first color filter 1112, the second color filter 1122 and the third color filter 1132.

An embodiment of the present disclosure further provides a display device. The display device includes any one of the display substrates provided by the above-described embodiments. Therefore, resolution of the display device may be improved, and a display device having true high resolution may be further provided. In addition, the pixel arrangement structure has better symmetry, so the display device has a better display effect.

For example, in some examples, the display device may be a smart phone, a tablet personal computer, a television, a monitor, a laptop, a digital photo frame, a navigator, and any other product or component having a display function.

An embodiment of the present disclosure further provides a mask plate set. The mask plate set is configured to form the pixel arrangement structure provided by any one of the above-described examples.

For example, the mask plate set may include a first mask plate for forming a first color sub-pixel block, a second mask plate for forming a second color sub-pixel block, and a third mask plate for forming a third color sub-pixel block; that is to say, the mask plate is a mask for evaporation.

For example, the first mask plate may be provided thereon with a first opening, to form a light-emitting layer of a first color sub-pixel block in an evaporation process; the second mask plate may be provided thereon with a second opening, to form a light-emitting layer of a second color sub-pixel block in an evaporation process; and the third mask plate may be provided thereon with a third opening, to form a light-emitting layer of a third color sub-pixel block in an evaporation process.

Figure 14A:
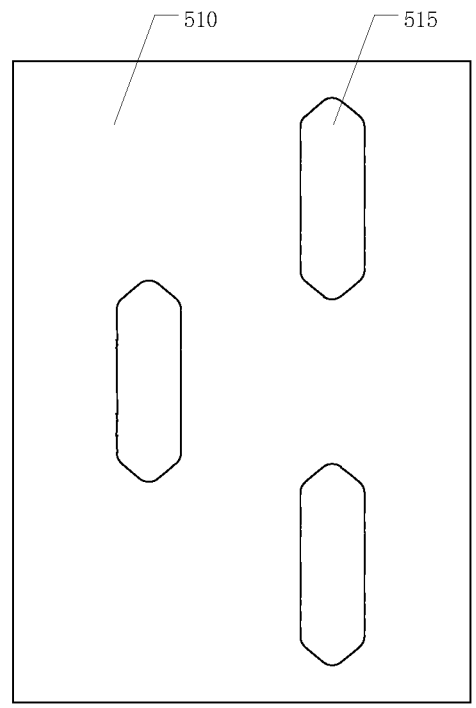
FIG. 14A is a schematic diagram of a first mask provided by an embodiment of the present disclosure.
Figure 14B:
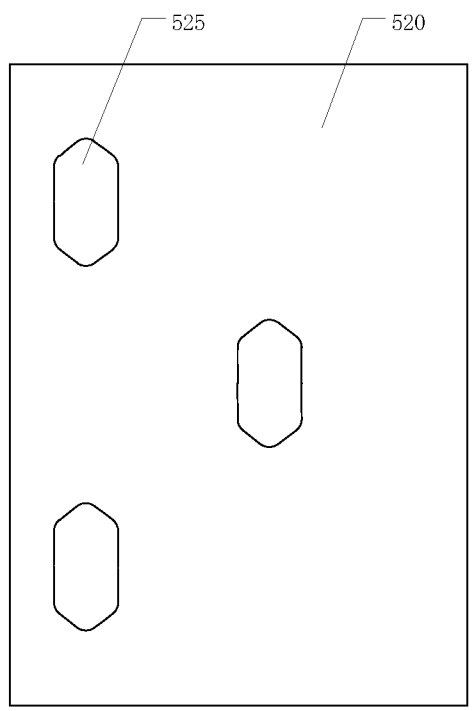
FIG. 14B is a schematic diagram of a second mask provided by the embodiment of the present disclosure.
Figure 14C:
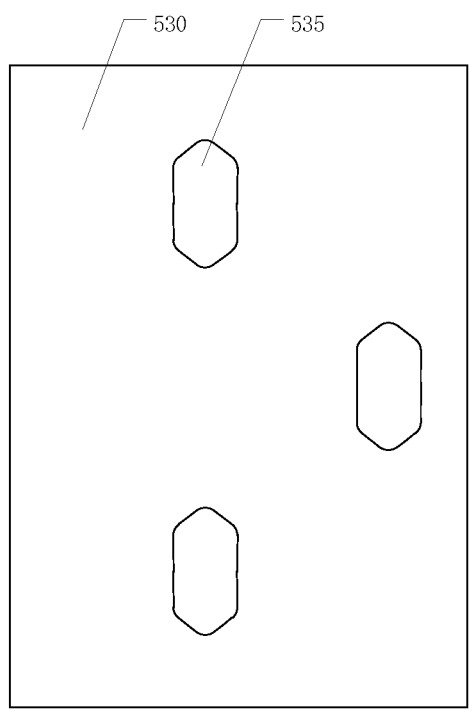
FIG. 14C is a schematic diagram of a third mask provided by the embodiment of the present disclosure.

FIG. 14A is a schematic diagram of the first mask plate provided by the embodiment of the present disclosure; FIG. 14B is a schematic diagram of the second mask plate provided by the embodiment of the present disclosure; and FIG. 14C is a schematic diagram of the third mask plate provided by the embodiment of the present disclosure. As illustrated by FIG. 14A to FIG. 14C, the mask plate set includes: a first mask plate 510, including a first opening 515, and configured to form a first color sub-pixel block; a second mask plate 520, including a second opening 525, and configured to form a second color sub-pixel block; and a third mask plate 530, including a third opening 535, and configured to form a third color sub-pixel block; wherein a first color light-emitting layer of a first color sub-pixel block of a third virtual rectangle and a first color light-emitting layer of a first color sub-pixel block of a fourth virtual rectangle are configured to be formed through the same first opening 515, which, thus, can reduce a fabrication difficulty and simplify a process.

For example, in some examples, a second color sub-pixel block of a first virtual rectangle and a second color sub-pixel block of a second virtual rectangle may be formed through the same second opening 525; and a third color sub-pixel of the first virtual rectangle and a third color sub-pixel block of the second virtual rectangle may also be formed through the same third opening 535.

What are described above is related to the illustrative embodiments of the disclosure only and not limitative to the scope of the disclosure; the scope of the disclosure are defined by the accompany drawings.

What is claimed is:

1. A display substrate, comprising a plurality of first sub-pixels, a plurality of second sub-pixels and a plurality of third sub-pixels, wherein the display substrate includes a plurality of pixel groups each of which includes two third sub-pixels, one first sub-pixel and one second sub-pixel, and each of the plurality of first sub-pixels is a red sub-pixel, each of the plurality of second sub-pixels is a blue sub-pixel, and each of the plurality of third sub-pixels is a green sub-pixel, the two third sub-pixels are arranged adjacent to each other along a first direction, the one first sub-pixel and the one second sub-pixel are adjacent to at least one of the two third sub-pixels, located on both sides of a straight line passing centers of the two third sub-pixels, and arranged along a second direction different from the first direction;

the plurality of pixel groups includes first pixel groups;

the plurality of pixel groups are arranged in an array in a plane defined by the first direction and the second direction;

the first direction is a direction in which a line connecting centers of the two third sub-pixels in each of the plurality of pixel groups extends, and the second direction is a direction in which a line connecting centers of the one first sub-pixel and the one second sub-pixel in each of the plurality of pixel groups extends, and the first direction is perpendicular to the second direction;

in the array, a number of the third sub-pixels is twice of a number of the first sub-pixels, and the number of the third sub-pixels is twice of a number of the second sub-pixels, each of the first sub-pixel, the second sub-pixel and the third sub-pixel has a planar shape of polygon, a longest side of the first sub-pixel is parallel to the first direction, and a longest side of the second sub-pixel is parallel to the first direction, and the third sub-pixel has a largest size along the first direction; and in each of the pixel groups, a straight line passing centers of the one first sub-pixel and one of the two third sub-pixels is not parallel to each of the first direction and the second direction, and a straight line passing centers of the one second sub-pixel and one of the two third sub-pixels is not parallel to each of the first direction and the second direction, and a gap is provided between the two third sub-pixels in each pixel group, and a length of the gap along the first direction is smaller than a length of the longest side of the first sub-pixel or a length of the longest side of the second sub-pixel.

2. The display substrate according to claim 1, wherein, in one first pixel group, at least one side of the second sub-pixel is parallel to the straight line passing centers of the two third sub-pixels, and the side of the second sub-pixel parallel to the straight line passing centers of the two third sub-pixels includes the side farthest from the two third sub-pixels in the second direction; and/or, at least one side of the first sub-pixel is parallel to the straight line passing centers of the two third sub-pixels, and the side of the first sub-pixel parallel to the straight line passing centers of the two third sub-pixels includes the side farthest from the two third sub-pixels in the second direction.

3. The display substrate according to claim 2, wherein, in one first pixel group, a distance from a center of the first sub-pixel to the straight line passing centers of the two third sub-pixels is different from a distance from a center of the second sub-pixel to the straight line passing centers of the two third sub-pixels.

4. The display substrate according to claim 1, wherein, in one first pixel group, the two third sub-pixels are symmetrical with respect to a straight line parallel to the second direction.

5. The display substrate according to claim 1, wherein, a length of the second sub-pixel in the first direction gradually increases along a direction from a position away from the two third sub-pixels to a position close to the two third sub-pixels.

6. The display substrate according to claim 1, wherein, in one first pixel group, at least one straight line parallel to the second direction passes through the first sub-pixel, the second sub-pixel and one of the two third sub-pixels, and at least one other straight line parallel to the second direction passes through the first sub-pixel, the second sub-pixel and the other one of the two third sub-pixels.

7. The display substrate according to claim 1, wherein, in one first pixel group, the second sub-pixel includes at least one oblique side relative to the first direction and the second direction, the first sub-pixel includes at least one oblique side relative to the first direction and the second direction, and the at least one oblique side of the second sub-pixel and the at least one oblique side of the first sub-pixel are not parallel to each other and are located on the same sides of the second sub-pixel and the first sub-pixel along the first direction, respectively.

8. The display substrate according to claim 1, wherein, in one first pixel group, each of the first sub-pixel, the second sub-pixel and the third sub-pixel includes sides parallel to each other.

9. The display substrate according to claim 1, wherein, a maximum length of the second sub-pixel in the first direction is larger than that of the first sub-pixel in the first direction.

10. The display substrate according to claim 1, wherein, a length of the side of the second sub-pixel close to the two third sub-pixels is greater than a length of the side of the first sub-pixel close to the two third sub-pixels.

11. The display substrate according to claim 1, wherein the plurality of pixel groups further comprises a second pixel group adjacent to the first pixel group, wherein centers of the two third sub-pixels in the first pixel group and centers of the two third sub-pixels in the second pixel group are located on the same straight line.

12. The display substrate according to claim 11, wherein, a distance between the two third sub-pixels in the first pixel group is smaller than a distance between the third sub-pixels in the first pixel group and the second pixel group adjacent to each other.

13. The display substrate according to claim 11, wherein, the third sub-pixels in one first pixel group and one second pixel group adjacent to each other are all arranged in the first direction, the first sub-pixel in the first pixel group and the second sub-pixel in the second pixel group are located at a first side of the third sub-pixels arranged in the first direction, the second sub-pixel in the first pixel group and the first sub-pixel in the second pixel group are located at the second side of the third sub-pixels arranged in the first direction, and the first side and the second side of the third sub-pixels are two sides of the third sub-pixels opposite to each other in the second direction.

14. The display substrate according to claim 1, wherein, each of the plurality of third sub-pixels has an asymmetric shape in the first direction or the second direction.

15. The display substrate according to claim 1, wherein, a size of each of the plurality of third sub-pixels in the first direction is smaller than a size of each of the plurality of first sub-pixels in the first direction and a size of each of the plurality of second sub-pixels in the first direction.

\* \* \* \* \*